(12) United States Patent
Chu et al.

(10) Patent No.: US 10,012,873 B2
(45) Date of Patent: Jul. 3, 2018

(54) DISPLAY PANEL

(71) Applicant: AU Optronics Corporation, Hsin-chu (TW)

(72) Inventors: Kung-Ching Chu, Hsin-chu (TW); Ju-Chin Chen, Hsin-chu (TW); Sung-Yu Su, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 228 days.

(21) Appl. No.: 15/083,767

(22) Filed: Mar. 29, 2016

(65) Prior Publication Data
US 2017/0108743 A1    Apr. 20, 2017

(30) Foreign Application Priority Data

Oct. 20, 2015 (TW) .............................. 104134285 A

(51) Int. Cl.
| G02F 1/1343 | (2006.01) |
| G02F 1/1333 | (2006.01) |
| G02F 1/1335 | (2006.01) |
| G02F 1/1362 | (2006.01) |
| G02F 1/1368 | (2006.01) |
| H01L 27/12 | (2006.01) |

(52) U.S. Cl.
CPC ...... G02F 1/134309 (2013.01); G02F 1/1368 (2013.01); G02F 1/133305 (2013.01); G02F 1/133512 (2013.01); G02F 1/136286 (2013.01); H01L 27/124 (2013.01); G02F 2001/134345 (2013.01); G02F 2201/123 (2013.01)

(58) Field of Classification Search
CPC ......... G02F 1/133305; G02F 1/136286; G02F 1/134309; G02F 1/133512; G02F 1/1368; H01L 27/124
See application file for complete search history.

(56) References Cited

U.S. PATENT DOCUMENTS

| 7,834,962 B2 | 11/2010 | Satake et al. |
| 2009/0161048 A1 | 6/2009 | Satake et al. |
| 2014/0176856 A1 | 6/2014 | Lee et al. |

FOREIGN PATENT DOCUMENTS

| CN | 101464582 A | 6/2009 |
| CN | 103901677 A | 7/2014 |

OTHER PUBLICATIONS

Office Action issued by the State Intellectual Property Office of the Peoples Republic of China dated Dec. 18, 2017 or Application No. CN 201510917100.5.

*Primary Examiner* — Hoan C Nguyen

(74) *Attorney, Agent, or Firm* — Tim Tingkang Xia, Esq.; Locke Lord LLP

(57) ABSTRACT

A display panel is divided into a first region and a second region located outside the first region, and includes a first sub-pixel, a second sub-pixel, a plurality of scan lines, a first common line, a second common line, and a black matrix. In the first sub-pixel, a first distance exists between the first common line and a neighboring scan line along a second direction. In the second sub-pixel, a second distance exists between the second common line and a neighboring scan line along the second direction, and the first distance is not equal to the second distance. The black matrix has a plurality of holes, including a first hole and a second hole. The first hole exposes the first sub-pixel and the first common line located in the first region. The second hole exposes the second sub-pixel and the second common line located in the second region.

52 Claims, 12 Drawing Sheets

DISPLAY PANEL

CROSS-REFERENCE TO RELATED APPLICATIONS

This application claims the priority to and the benefit of, pursuant to 35 U.S.C. § 119(a), Taiwanese Patent Application No. 104134285, filed Oct. 20, 2015, the content of which is incorporated herein in its entirety by reference.

TECHNICAL FIELD

The present disclosure relates generally to a display panel, and in particular, to a display panel having a balanced alignment mechanism.

BACKGROUND

Typically, in a general method for fabricating a curved display panel, a flat display panel (DISPLAY PANEL) may be bent to fabricate a curved display panel. Generally, a patterned light-shielding layer (for example, a black matrix) is configured on an opposing substrate of a display panel to shield a region, where an opaque element (for example, a signal line and a switch element) is configured on an array substrate and a region where a problem of a leakage of light may occur at an edge of the signal line (the regions are generally referred to as a shielded region hereinafter). However, because a relative displacement may occur between the patterned light-shielding layer disposed on the opposing substrate and the shielded region disposed on the array substrate due to the bending of the curved display panel, the patterned light-shielding layer in the curved display panel cannot completely cover the shielded region, and instead light may penetrate a shielded portion, which therefore results in a leakage of light. In addition, the relative displacement between the patterned light-shielding layer and the array substrate also causes inconsistent alignment configurations of sub-pixels of different regions, resulting in a problem of a color difference in viewing from different view angles, which affects a display effect of the curved display panel.

SUMMARY OF THE INVENTION

One of the objectives of the present disclosure is to provide a display panel, where positions where common lines in sub-pixels of the display panel are disposed are not completely same, thereby alleviating problems such as a leakage of light, inconsistent alignment, and a color difference that occur in a general curved display panel because of the bending of the panel.

One aspect of the present disclosure provides a display panel. The display panel includes: a first substrate, a second substrate, a display medium, a plurality of scan lines, a plurality of data lines, a plurality of sub-pixels, a plurality of common lines, and a black matrix. The display medium is located between the first substrate and the second substrate. The scan lines and the data lines are located on the first substrate, where each scan line extends along a first direction, each data line extends along a second direction, and a central line extends along the first direction, such that a first region and a second region located outside the first region are defined on the display panel, where the central line passes through the first region. The sub-pixels are disposed on the first substrate, where each sub-pixel includes at least one active element and a pixel electrode connected to a drain electrode of the active element, a source electrode of each active element is connected to one of the data lines, and a gate electrode of each active element is connected to one of the scan lines. The plurality of sub-pixels includes a plurality of first sub-pixels and a plurality of second sub-pixels. The plurality of first sub-pixels is located in the first region and is arranged into at least one first sub-pixel row along the first direction, and the plurality of second sub-pixels is located in the second region and is arranged into at least one second sub-pixel row along the first direction. The plurality of common lines is disposed on the first substrate, where the common lines include at least one first common line and at least one second common line. The first common line is located in the first region, and extends along the first direction to pass through the first sub-pixel row, where in each first sub-pixel of the first sub-pixel row located in the first region, a first distance exists between the first common line and a neighboring scan line along the second direction. The second common line is located in the second region, and extends along the first direction to pass through the second sub-pixel row, and the first common line and the second common line are arranged along the second direction, where in each second sub-pixel of the second sub-pixel row located in the second region, a second distance exists between the second common line and a neighboring scan line along the second direction, and the first distance is not equal to the second distance. Moreover, the black matrix is disposed on the second substrate and has a plurality of holes, which separately and partially exposes the sub-pixels. The holes include a plurality of first holes and a plurality of second holes, where the first holes respectively expose the first sub-pixels of the first sub-pixel row and the first common line located in the first region, and the second holes respectively expose the second sub-pixels of the second sub-pixel row and the second common line located in the second region.

Another embodiment of the present disclosure provides a display panel. The display panel includes: a first substrate, a second substrate, a display medium, a plurality of scan lines, a plurality of data lines, a plurality of sub-pixels, a plurality of common lines, and a black matrix. The display medium is located between the first substrate and the second substrate. The scan lines and the data lines are located on the first substrate, where each scan line extends along a first direction, each data line extends along a second direction, and a central line extends along the first direction, such that a first region and a second region located outside the first region are defined on the display panel, wherein the central line passes through the first region. The sub-pixels are disposed on the first substrate, where each sub-pixel includes at least one active element and a pixel electrode connected to a drain electrode of the active element, a source electrode of each active element is connected to one of the data lines, and a gate electrode of each active element is connected to one of the scan lines. The plurality of sub-pixels includes a plurality of first sub-pixels and a plurality of second sub-pixels. The plurality of first sub-pixels is located in the first region and is arranged into at least one first sub-pixel column along the first direction, and the plurality of second sub-pixels is located in the second region and is arranged into at least one second sub-pixel column along the first direction. The plurality of common lines is disposed on the first substrate, where the common lines include at least one first common line and at least one second common line. The first common line is located in the first region, and extends along the first direction to pass through the first sub-pixel column. The second common line is located in the second region, and extends along the first direction to pass through the second sub-pixel column, and the first common line and the second common line are arranged along the second direction. Moreover, the black matrix is disposed on the second substrate and has a plurality of holes, which respectively and partially exposes the sub-pixels. The holes include a plurality of first holes and a plurality of second holes, where the first holes respectively expose the first sub-pixels of the first sub-pixel column and the first common line located in the first region, and the second holes respectively expose the second sub-pixels of the second sub-pixel column and the second common line located in the second region. When the display panel presents a bent state, the display panel is bent with the central line as an axis, a first offset exists in the second direction between each first hole and the first common line, a second offset exists in the second direction between each second hole and the second common line, and the first offset is not equal to the second offset.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION OF THE DISCLOSURE

Figure 1:
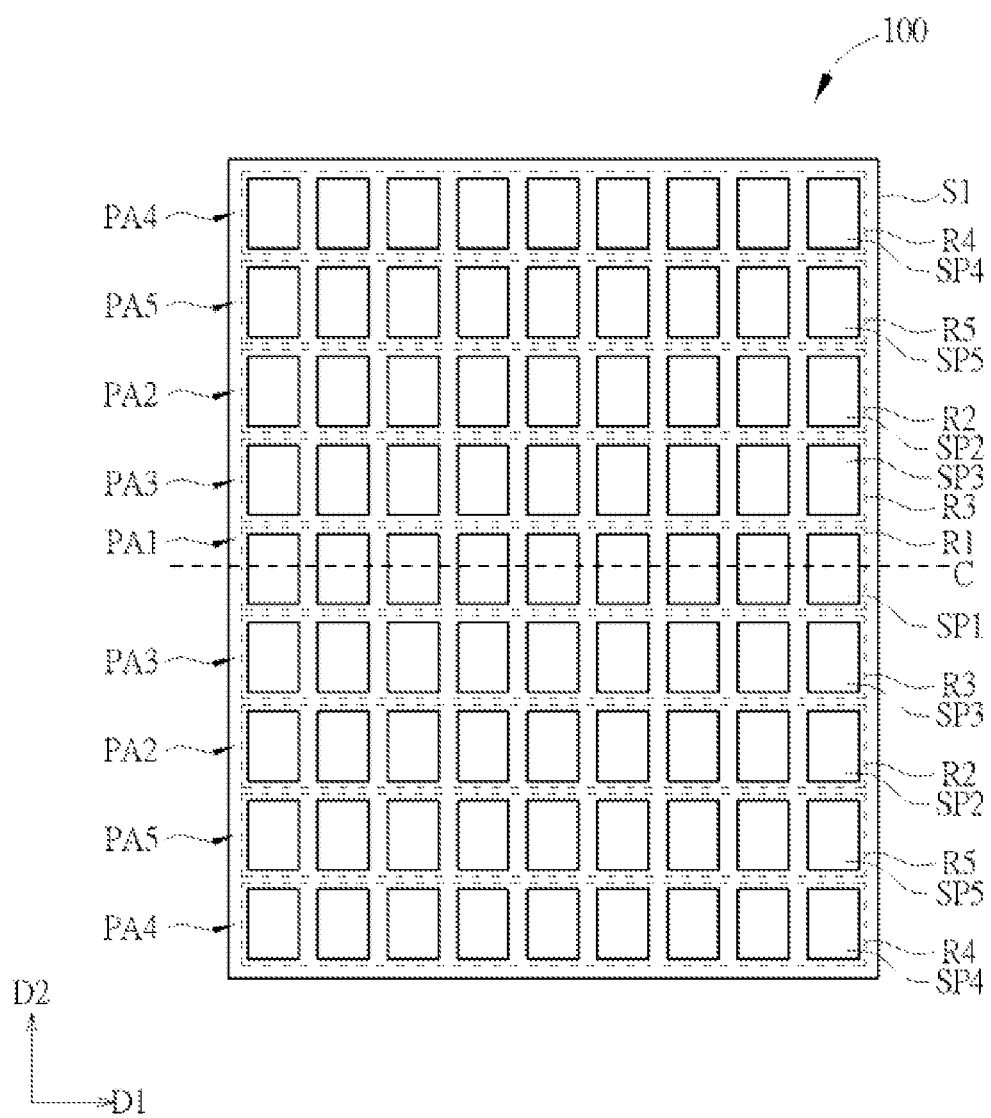
FIG. 1 is a schematic top view of a display panel according to a first embodiment of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The following detailed description describes in detail the characteristics and advantages of the instant disclosure, whose content is sufficient to enable any person skilled in the relevant art to understand the technical content of the instant disclosure and implement accordingly, and according to the content, the claims and figures disclosed by the present specification, any person skilled in the relevant art can easily understand the purpose and advantages of the instant disclosure. The following embodiments further illustrate the aspects of the instant disclosure, but do not limit the scope of the instant disclosure with any aspects.

Figure 2:
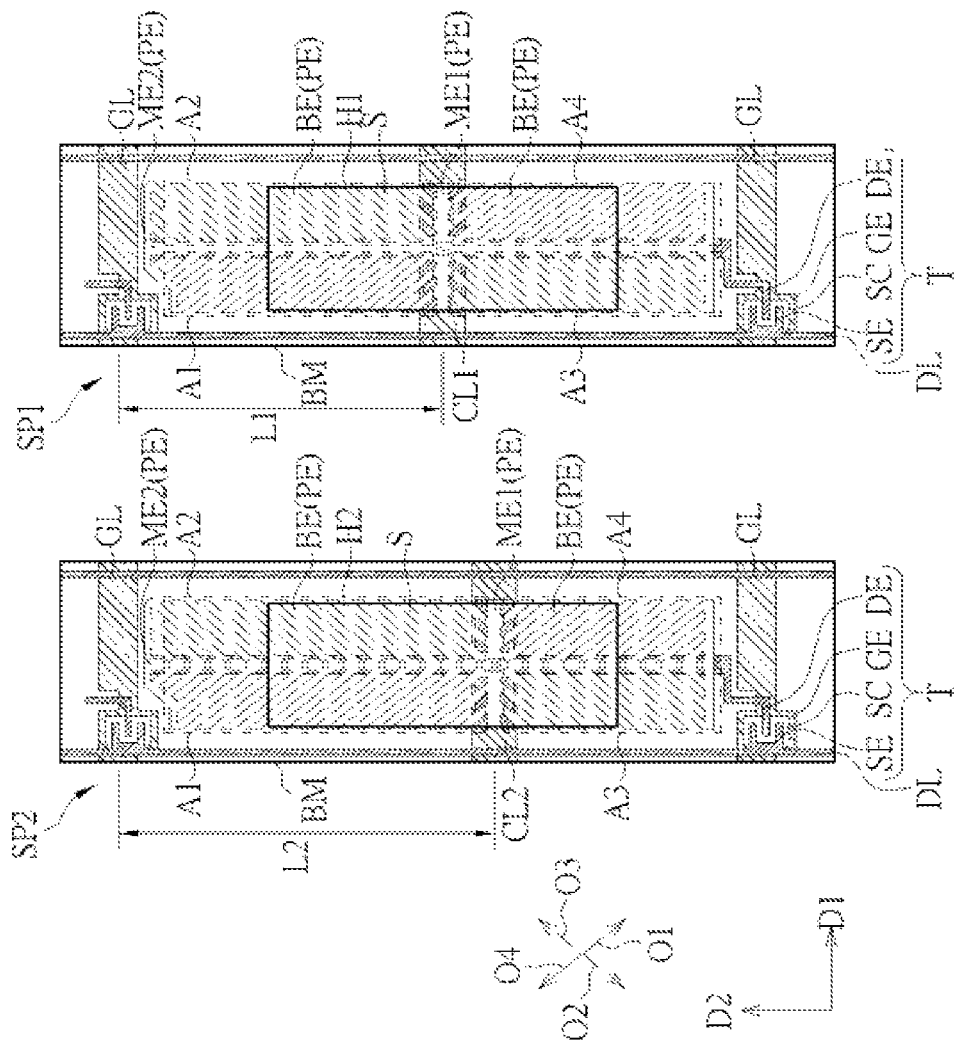
FIG. 2 is an enlarged schematic view of local pixels of the display panel according to the first embodiment.
Figure 3:
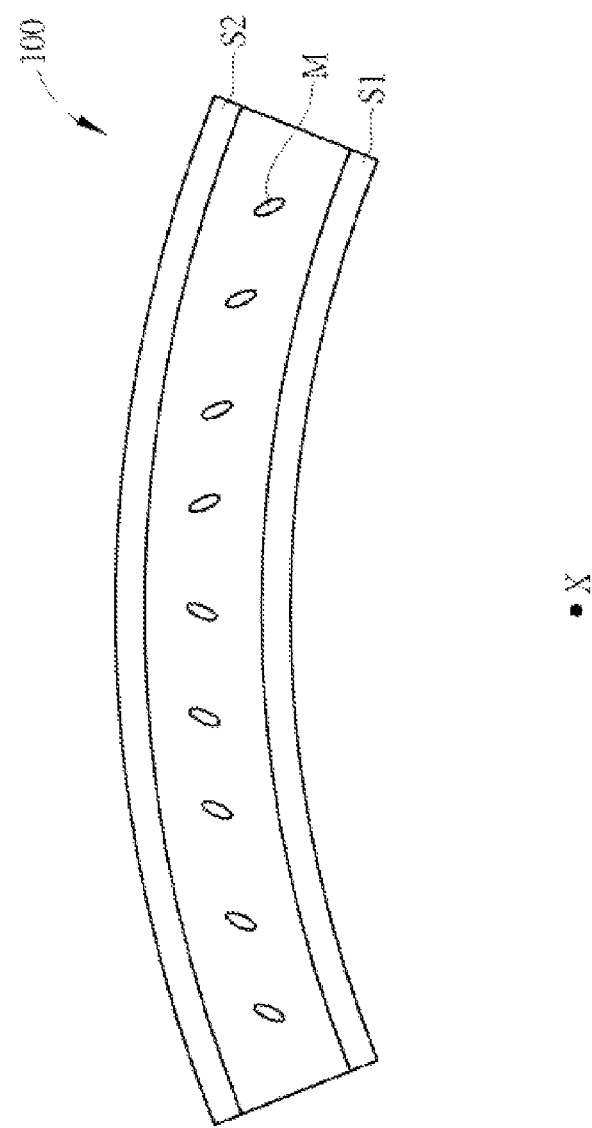
FIG. 3 is a schematic side view of the display panel in a bent state according to the first embodiment of the present disclosure.

FIG. 1 is a schematic top view of a display panel according to a first embodiment of the present disclosure. FIG. 2 is an enlarged schematic view of local pixels of the display panel according to the first embodiment. FIG. 3 is a schematic side view of the display panel in a bent state according to the first embodiment of the present disclosure. A display panel 100 in this embodiment is a flexible display panel, where FIGS. 1 and 2 show that a surface of the display panel 100 is in a planar and unbent state. As shown in the figures, the display panel 100 has a central line C. The central line C is a virtual central line of the display panel 100, which is defined such that the display panel 100 is line-symmetrical to the central line C, and a first region R1 and a second region R2 located outside the first region R1 are defined on the display panel 100 such that the central line C passes through the first region R1 and not the second region R2, where the central line C is located at the center of the display panel 100 and substantially extends along a first direction D1 to substantially and equally divide the display panel 100 shown in FIG. 1 into an upper block (or area, or region) and a lower block. The first region R1 includes a region where the central line C passes on the display panel 100, and the second region R2 does not have the central line C passing through. The display panel 100 in this embodiment includes two second regions R2, respectively located on an upper side and a lower side of the first region R1, but is not limited thereto. The display panel 100 of the present disclosure includes: a first substrate S1, a second substrate S2, a display medium M, a plurality of scan lines GL, a plurality of data lines DL, a plurality of sub-pixels, a plurality of common lines, and a black matrix BM, where the plurality of common lines is substantially parallel to the central line C. The relative disposing relationships among the foregoing elements are sequentially introduced in different paragraphs below.

The first substrate S1 and the second substrate S2 are disposed opposite to each other. The display medium M is disposed between the first substrate S1 and the second substrate S2. In certain embodiments, the first substrate S1 and the second substrate S2 may respectively include a translucent substrate, for example, a glass substrate, a plastic substrate or another rigid or flexible substrate. For example, the first substrate S1 and the second substrate S2 may be respectively an array substrate and an opposing substrate, and the display medium M may be a layer of liquid crystal molecules. The scan lines GL and the data lines DL are located on the first substrate S1, where each scan line GL substantially extends along the first direction D1, and each data line DL substantially extends along a second direction D2. Preferably, in this embodiment, the first direction D1 is substantially perpendicular to the second direction D2, but is not limited thereto. Moreover, the central line C is substantially parallel to the first direction D1, and the central line C is substantially perpendicular to the second direction D2. The display panel 100 includes the plurality of sub-pixels, arranged in an array, and disposed on the first substrate S1. For example, the sub-pixels may be disposed on an inner surface of the first substrate S1 facing the second substrate S2, and each sub-pixel includes an active element T. The active element T includes a source electrode SE, a drain electrode DE, a gate electrode GE, and a semiconductor layer SC. In certain embodiments, the active element T may be various types of active element, including a bottom-gate active element T in which the semiconductor layer SC is located on the gate electrode and is located between the source electrode SE and the drain electrode DE, a top-gate active element T in which the semiconductor layer SC is located under the gate electrode and is located between the source electrode SE and the drain electrode DE, or other active element T of a suitable type. In certain embodiments, a material of the semiconductor layer SC may include polycrystalline silicon, amorphous silicon, monocrystalline silicon, nanocrystalline silicon, an oxide semiconductor material, an organic semiconductor material, or other suitable materials. The source electrode SE of each active element T is connected to a data line DL, and the gate electrode GE of each active element T is connected to a scan line GL. In addition, each sub-pixel further includes a pixel electrode PE connected to the drain electrode DE of the active element T.

The sub-pixels in this embodiment at least include a plurality of first sub-pixels SP1 and a plurality of second sub-pixels SP2. The plurality of first sub-pixels SP1 is located in the first region R1 and is substantially arranged along the first direction D1 to form at least one first sub-pixel row PA1, and the plurality of second sub-pixels SP2 is located in the second region R2 and is substantially arranged along the first direction D1 to form at least one second sub-pixel row PA2. In this embodiment, an example is provided in which the second sub-pixels SP2 in each second region R2 are respectively arranged to form a second sub-pixel row PA2. The plurality of common lines of the display panel 100 is disposed on the first substrate S1, where the common lines include a first common line CL1 and a second common line CL2, where the first common line CL1 and the second common line CL2 are both substantially parallel to the central line C. The first common line CL1 is located in the first region R1 and substantially extends along the first direction D1 to pass through the first sub-pixel row PA1. In certain embodiments, in each first sub-pixel SP1 of the first sub-pixel row PA1 located in the first region R1, a vertical distance between the first common line CL1 and one of the two neighboring scan lines GL along the second direction D2 is defined as a first distance L1. In other words, the first common line CL1 neighbors with the corresponding scan line GL in each first sub-pixel SP1. The vertical distance refers to a distance between the center of the first common line CL1 and the center of the scan line GL, that is, a distance between the center of the first common line CL1 and the center of the scan line GL when the first common line CL1 and the scan line GL are both projected to a D1-D2 plane (for example, the first substrate S1) along a vertical projection direction (i.e., the direction perpendicular to the display panel), which is defined similarly below and is no longer elaborated. On the other hand, the second common line CL2 is located in the second region R2 and extends along the first direction D1 to pass through the second sub-pixel row PA2, and the first common line CL1 and the second common line CL2 shift from each other along the second direction D2. In certain embodiments, in each second sub-pixel SP2 of the second sub-pixel row PA2 located in the second region R2, a vertical distance between the second common line CL2 and one of the two neighboring scan lines GL along the second direction D2 is defined as a second distance L2. In other words, the second common line CL2 neighbors with the corresponding scan line GL in each second sub-pixel SP2. In certain embodiments, the first distance L1 is not equal to the second distance L2. Preferably, the second distance L2 is greater than the first distance L1. That is, the vertical distance between the second common line CL2 and the neighboring scan line GL in the second sub-pixel SP2 along the second direction D2 is greater than the vertical distance between the first common line CL1 and the neighboring scan line GL in the first sub-pixel SP1 along the second direction D2.

The pixel electrode PE in this embodiment at least includes about a cross-shaped main electrode and a plurality of branch electrodes BE, where the cross-shaped main electrode includes a first main electrode ME1 substantially extending along the first direction D1, and a second main electrode ME2 substantially extending along the second direction D2 and intersecting with the first main electrode ME1. An end of each branch electrode BE is connected to the cross-shaped main electrode, and each branch electrode BE extends from the cross-shaped main electrode such that the branch electrodes BE extend along at least four different directions. In particular, each sub-pixel is divided by the cross-shaped main electrode to include at least four different alignment regions, and the branch electrodes in each of the at least four different alignment regions extends toward a different direction such that all of the branch electrodes extend along at least four different directions. The first main electrode of the cross-shaped main electrode ME1 of each pixel electrode PE overlaps the corresponding common line as observed in a vertical projection direction (i.e., the direction perpendicular to the display panel). It should be noted that, in this embodiment, a width of the common line is greater than a width of the first main electrode ME1 such that as observed in the vertical projection direction, the first main electrode ME1 partially overlaps the corresponding common line, but is not limited thereto. For example, in the first sub-pixel SP1, the first main electrode ME1 of the pixel electrode PE and the first common line CL1 partially overlap as observed in the vertical projection direction, and in the second sub-pixel SP2, the first main electrode ME1 of the pixel electrode PE and the second common line CL2 partially overlap as observed in the vertical projection direction.

Referring to the first sub-pixel SP1 and the second sub-pixel SP2 shown in FIG. 2, each first sub-pixel SP1 and each second sub-pixel SP2 may include a plurality of alignment regions. In this embodiment, each first sub-pixel SP1 and each second sub-pixel SP1 respectively include a first alignment region A1, a second alignment region A2, a third alignment region A3, and a fourth alignment region A4. The first alignment region A1 and the second alignment region A2 are substantially arranged in sequence along the first direction D1. The third alignment region A3 is adjacent to the first alignment region A1 in the second direction D2, and the fourth alignment region A4 is adjacent to the second alignment region A2 in the second direction D2. In certain embodiments, liquid crystal molecules corresponding to the first alignment region A1, the second alignment region A2, the third alignment region A3, and the fourth alignment region A4 in this embodiment respectively have only one alignment direction, that is, an extending direction of the branch electrode BE. For example, the liquid crystal molecules corresponding to the first alignment region A1 are all substantially aligned along a direction O1, the liquid crystal molecules corresponding to the second alignment region A2 are all substantially aligned along a direction O2, the liquid crystal molecules corresponding to the third alignment region A3 are all substantially aligned along a direction O3, and the liquid crystal molecules corresponding to the fourth alignment region A4 are all substantially aligned along a direction O4, where the direction O1, the direction O2, the direction O3, and the direction O4 are respectively different directions. For example, the direction O1 and the direction O2 may be substantially perpendicular to each other, and the direction O3 and the direction O4 may be substantially perpendicular to each other, and respectively have an included angle of about 45 degrees from the first direction D1, but is not limited thereto. In this embodiment, shapes of the first alignment region A1, the second alignment region A2, the third alignment region A3, and the fourth alignment region A4 may be any shapes, for example, substantial rectangles, but are not limited thereto. It should be noted that in the present disclosure, the alignment regions of the first sub-pixel SP1 may have substantially equal area, and the alignment regions of the second sub-pixel SP2 substantially do not have completely equal area. For example, in the first sub-pixel SP1, the first alignment region A1, the second alignment region A2, the third alignment region A3, and the fourth alignment region A4 have substantially same area. However, in the second sub-pixel SP2, the first alignment region A1 and the second alignment region A2 have substantially same area, and the third alignment region A3 and the fourth alignment region A4 have substantially same area, but the third alignment region A3 and the first alignment region A1 have substantially unequal areas.

Moreover, in each sub-pixel, the first main electrode ME1 and the second main electrode ME2 are located on the first substrate S1 and are located within a boundary between any two of the first alignment region A1, the second alignment region A2, the third alignment region A3, and the fourth alignment region A4. The branch electrodes BE are connected to the first main electrode ME1 and/or the second main electrode ME2 and respectively extend in the first alignment region A1, the second alignment region A2, the third alignment region A3, and the fourth alignment region A4. The branch electrodes BE located in the first alignment region A1, the second alignment region A2, the third alignment region A3, and the fourth alignment region A4 are substantially parallel to the direction O1, the direction O2, the direction O3, and the direction O4, respectively, and a slit S respectively exists between two neighboring ones of the branch electrodes BE. In certain embodiments, a material of the pixel electrode PE may include a transparent electrically conductive material such as a metal oxide, for example, indium tin oxide (ITO), indium zinc oxide (IZO), aluminum zinc oxide (AZO), aluminum indium oxide (AIO), indium oxide (InO), and gallium oxide (GaO), or another suitable material. In addition, the display panel 100 in this embodiment may further include a common electrode (not shown), disposed on a surface of the second substrate S2 or disposed on the first substrate S1.

The black matrix BM of the display panel 100 of the present disclosure is disposed on the second substrate S2. For example, the black matrix BM may be disposed on an inner surface of the second substrate S2 facing the first substrate S1. The black matrix BM has a plurality of holes, which respectively and partially exposes the sub-pixels, and each hole in this embodiment has a substantially same area and shape, but is not limited thereto. As shown in FIG. 2, the holes of the black matrix BM include a plurality of first holes H1 and a plurality of second holes H2, where each first hole H1 respectively corresponds to one of the first sub-pixels SP1 of the first sub-pixel row PA1 located in the first region R1, and partially exposes the first sub-pixel SP1 and the first common line CL1 passing through the first sub-pixel SP1; and similarly, each second hole H2 respectively corresponds to one of the second sub-pixels SP2 of the second sub-pixel row PA2 located in the second region R2, and partially exposes the second sub-pixel SP2 and the second common line CL2 passing through the second sub-pixel SP2. Precisely, the black matrix BM shields (or covers) the first sub-pixel SP1 and exposes partially the first alignment region A1, the second alignment region A2, the third alignment region A3, and the fourth alignment region A4. Further, in the first sub-pixel SP1, areas of the first alignment region A1, the second alignment region A2, the third alignment region A3, and the fourth alignment region A4 exposed by the first hole H1 are substantially same. In other words, as observed in a vertical projection direction, the first common line CL1 has substantially equal distances from two adjacent edges of each first hole H1 along the second direction D2, that is, the first common line CL1 is located at the center of the first hole H1. On the other hand, for the second sub-pixel SP2, because the second distance L2 between the scan line GL and the second common line CL2 is relatively larger, the black matrix BM exposes a relatively large area of the first alignment region A1 and the second alignment region A2, and exposes a relatively small area of the third alignment region A3 and the fourth alignment region A4. In other words, the second common line CL2 substantially has unequal distances from two adjacent edges of the second hole H2 along the second direction D2, that is, the second common line CL2 is not located at the center of the second hole H2.

Figure 4:
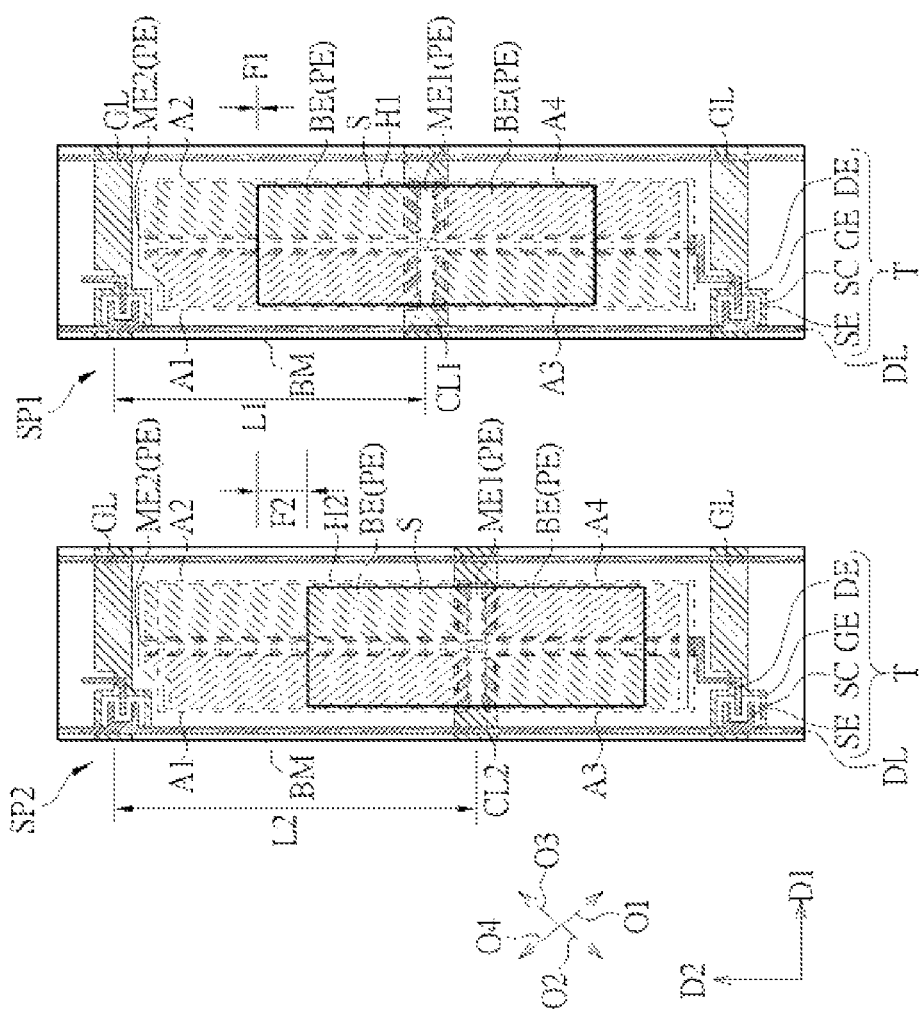
FIG. 4 is a schematic view of the pixels shown in FIG. 2 in a bent state.

Referring to both FIGS. 3 and 4, where FIG. 4 is a schematic view of the pixels shown in FIG. 2 in a bent state. The display panel 100 in the bent state may be bent (or curvy) as shown in FIG. 3, the display panel 100 in this embodiment is bent with the central line C as an axis, and a radius of curvature of the bending of the display panel 100 may be decided according to a product specification. For example, the display panel 100 in this embodiment has a curvature center X, and the first substrate S1 is located between the second substrate S2 and the curvature center X. In other words, the curvature center X is located on a side of the display panel 100 and is close to the first substrate S1, as shown in FIG. 3. In another variant embodiment, the display panel 100 may also be bent in a direction towards the second substrate S2, that is, the curvature center X is located on the other side of the display panel 100 and is close to the second substrate S2. Because the display panel 100 is bent with the central line C as the axis in a direction towards the first substrate S1, deformations of different degrees occur in the first substrate S1 and the second substrate S2 under different stresses, so that different sub-pixels of different regions on the second direction D2 and the holes of the black matrix BM have different relative relationships. When the display panel 100 is bent, the holes of the black matrix BM of the display panel 100 have, relative to the common lines in the sub-pixels, a displacement amount in the second direction D2, that is, a distance of a displacement in the second direction D2 between the holes and the common line is defined as an offset, while a size of the offset varies with different sub-pixels located in different regions. For example, because the first sub-pixel SP1 is located in the first region R1 near the central line C, when the display panel 100 is bent, a position of the first hole H1 corresponding to the first sub-pixel SP1 hardly moves, so that the first hole H1 still exposes substantially the same area of the first alignment region A1, the second alignment region A2, the third alignment region A3, and the fourth alignment region A4. That is, the area of the first alignment region A1, the second alignment region A2, the third alignment region A3, and the fourth alignment region A4 exposed by the first hole H1 before and after the display panel 100 is bent may be substantially the same. Therefore, a first offset F1 exists in the second direction D2 between each first hole H1 and the first common line CL1, and the first offset F1 is substantially equal to 0.

On the other hand, because the second sub-pixel SP2 is located in the second regions R2 on an upper side and/or a lower side of the first sub-pixel SP1, when the display panel 100 is in a bent state, a deformation of the first substrate S1 is less than a deformation of the second substrate S2, and therefore the black matrix BM is offset from an original position, causing a position of the second hole H2 in the second sub-pixel SP2 to move downwards. Therefore, the second hole H2 may expose the same areas of the first alignment region A1, the second alignment region A2, the third alignment region A3, and the fourth alignment region A4. That is, the exposed areas of the alignment regions of each second sub-pixel SP2 may become substantially equal, and an alignment condition of the second sub-pixel SP2 is substantially equivalent to an alignment condition of the first sub-pixel SP1. In other words, a second offset F2 exists in the second direction D2 between each second hole H2 and the second common line CL2, and the first offset F1 is not equal to the second offset F2. Further, the second offset F2 is substantially equal to a difference value between the second distance L2 and the first distance L1, the second offset F2 is greater than the first offset F1, and the second offset F2 is not equal to 0. By means of the foregoing configuration, each first sub-pixel SP1 and each second sub-pixel SP2 may normally provide display, and exposed areas of the alignment regions of each first sub-pixel SP1 are substantially equal, and exposed areas of the alignment regions of each second sub-pixel SP2 are also substantially equal. Therefore, the display panel 100 may provide a uniform and consistent wide-view-angle display effect.

As can be seen from above, when the display panel 100 is implemented as an flat panel display (FPD), a relative displacement may occur between the black matrix BM and a pixel array (common line) because of an alignment error or another factor, and in this case, a configuration between the holes of the black matrix BM and alignment regions of the sub-pixels above may provide a compensation effect to cause liquid crystal molecules of sub-pixels at all positions to provide multi-region alignment to keep a display effect. On the other hand, when the display panel 100 is implemented as a curved display panel or a flexible display panel (for example, when the display panel 100 is bent in a shape shown in FIG. 3), although a relative displacement may occur between the black matrix BM and the pixel array (common line) because of a bending or stress factor, in the present disclosure, a specific relative configuration between the holes of the black matrix BM and the common lines in different regions of sub-pixels may provide a compensation effect, causing the liquid crystal molecules of sub-pixels in all regions or all positions of the bent display panel 100 to provide consistent multi-region alignment to keep a good display effect. Further, in the display panel of the present disclosure, a design of offsetting the common line in the sub-pixel is used. Thus, it may be ensured that when the display panel of the present disclosure is in a bent state, the liquid crystal molecules of the sub-pixels at all the positions or in all the regions may provide consistent alignment, causing all the sub-pixels to have an effect of consistent multi-region alignment, so that a problem of a color difference that occurs in viewing from different view angles is avoided.

The display panel of the present disclosure is not limited to the foregoing embodiment. Display panels in other preferred embodiments of the present disclosure are described below in sequence. For ease of comparison of differences among the embodiments and simplify description, same symbol and numeral may be used to label the same element in the following embodiments, and mainly the differences among the embodiments are described and repetitive parts are no longer elaborated.

Figure 5:
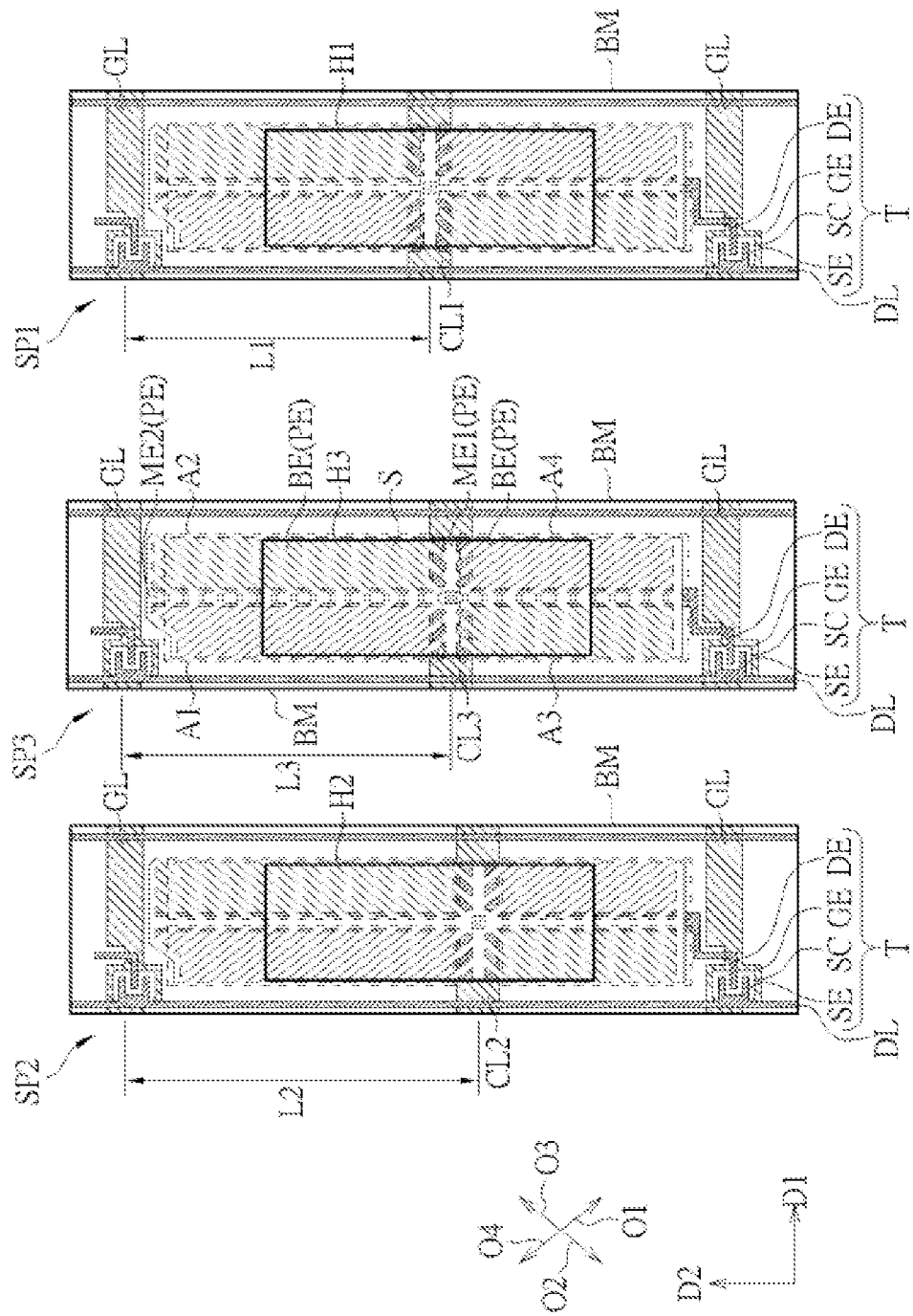
FIG. 5 is a partial enlarged schematic view of local pixels of a display panel according to a second embodiment of the present disclosure.
Figure 6:
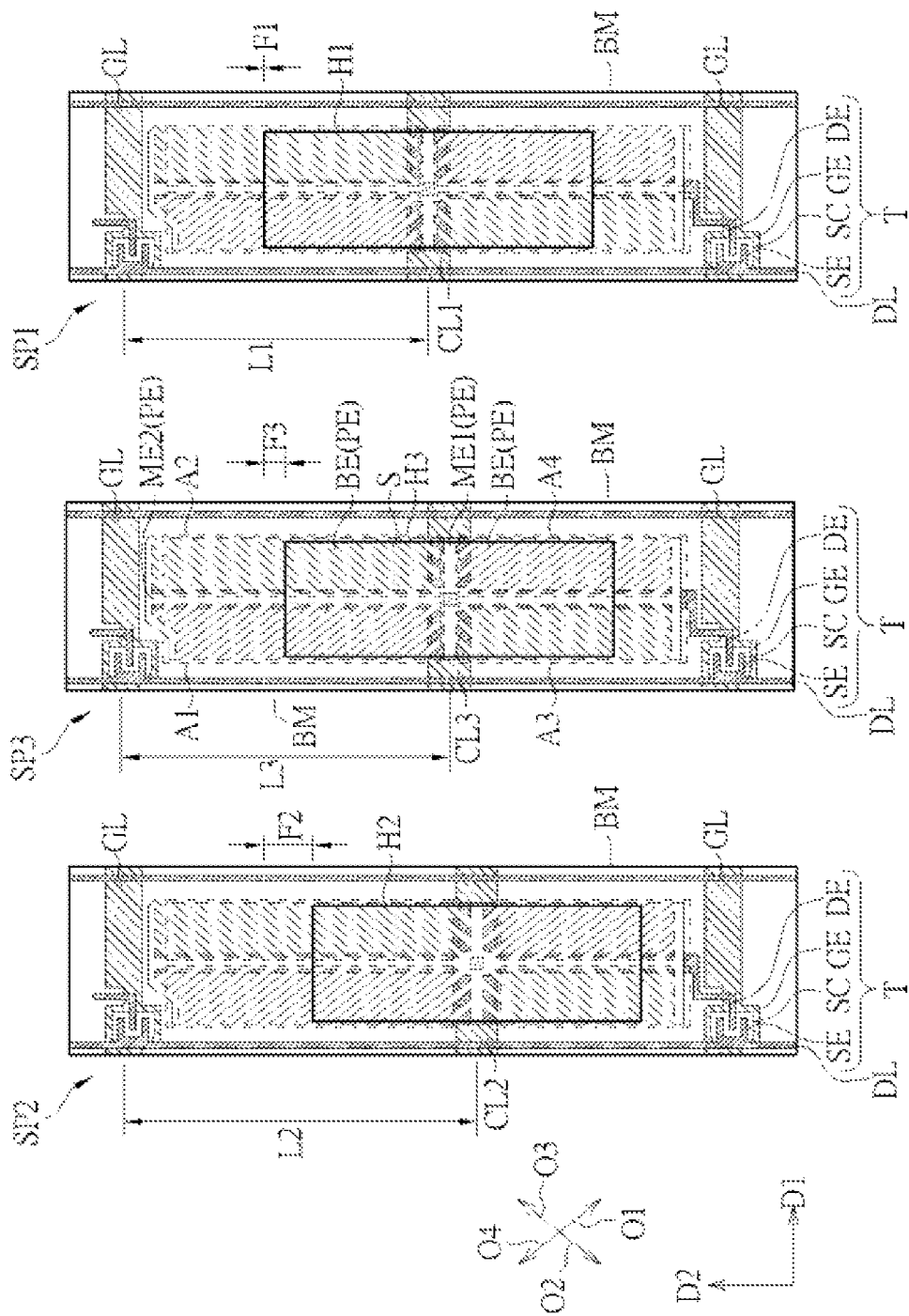
FIG. 6 is a schematic view of the pixels shown in FIG. 5 in a bent state.

A display panel in a second embodiment of the present disclosure is shown in FIGS. 5 and 6, where FIG. 5 is a partial enlarged schematic view of local pixels of the display panel according to the second embodiment of the present disclosure, and FIG. 6 is a schematic view of the pixels shown in FIG. 5 in a bent state. Referring to both FIGS. 1 and 5, the display panel 100 in this embodiment further includes a third region R3 located between the first region R1 and the second region R2, and the sub-pixels further include a plurality of third sub-pixels SP3 located in the third region R3 and substantially arranged along the first direction D1 to form a third sub-pixel row PA3. In addition, the common lines further include a third common line CL3 located in the third region R3 and substantially extending along the first direction D1 to pass through the third sub-pixel row PA3, where the third common line CL3 is substantially parallel to a central line C. In each third sub-pixel SP3 of the third sub-pixel row PA3 located in the third region R3, a third distance L3 exists between the third common line CL3 and the neighboring scan line GL along the second direction D2, and the third distance L3 is greater than the first distance L1 and is less than the second distance L2. In other words, the third common line CL3 neighbors with the corresponding scan line GL in the each third sub-pixel SP3. A design of a pixel electrode PE of the third region R3 is similar with that in the first embodiment, and is no longer elaborated herein. In addition, the holes of the black matrix BM further include a plurality of third holes H3, respectively exposing some of the third sub-pixels SP3 and the third common line CL3, and as observed in a vertical projection direction, the third common line CL3 substantially has unequal distances from two adjacent edges of each third hole H3 in the second direction D2. When the display panel 100 in the second embodiment is in a bent state (for example, when the display panel 100 is bent as shown in FIG. 3), each third hole H3 has a third offset F3 in the second direction D2 relative to the third common line CL3, causing a position of the third hole H3 in the third sub-pixel SP3 to move downwards, as shown in FIG. 6. Therefore, the third hole H3 exposes substantially the same area of the first alignment region A1, the second alignment region A2, the third alignment region A3, and the fourth alignment region A4. In addition, offsets and exposed areas of the first hole H1 and the second hole H2 relative to the first sub-pixel SP1 and the second sub-pixel SP2 are substantially the same as those in the first embodiment, and are no longer elaborated. It should be noted that the third offset F3 in the third sub-pixel SP3 is greater than the first offset F1 in the first sub-pixel SP1, and the third offset F3 is less than the second offset F2 in the second sub-pixel SP2, where the third offset F3 is not equal to 0, and the third offset F3 is substantially equal to a difference value between the third distance L3 and the first distance L1. Therefore, when in a bent state, the display panel in the second embodiment may provide a uniform and consistent wide-angle display effect.

Figure 7:
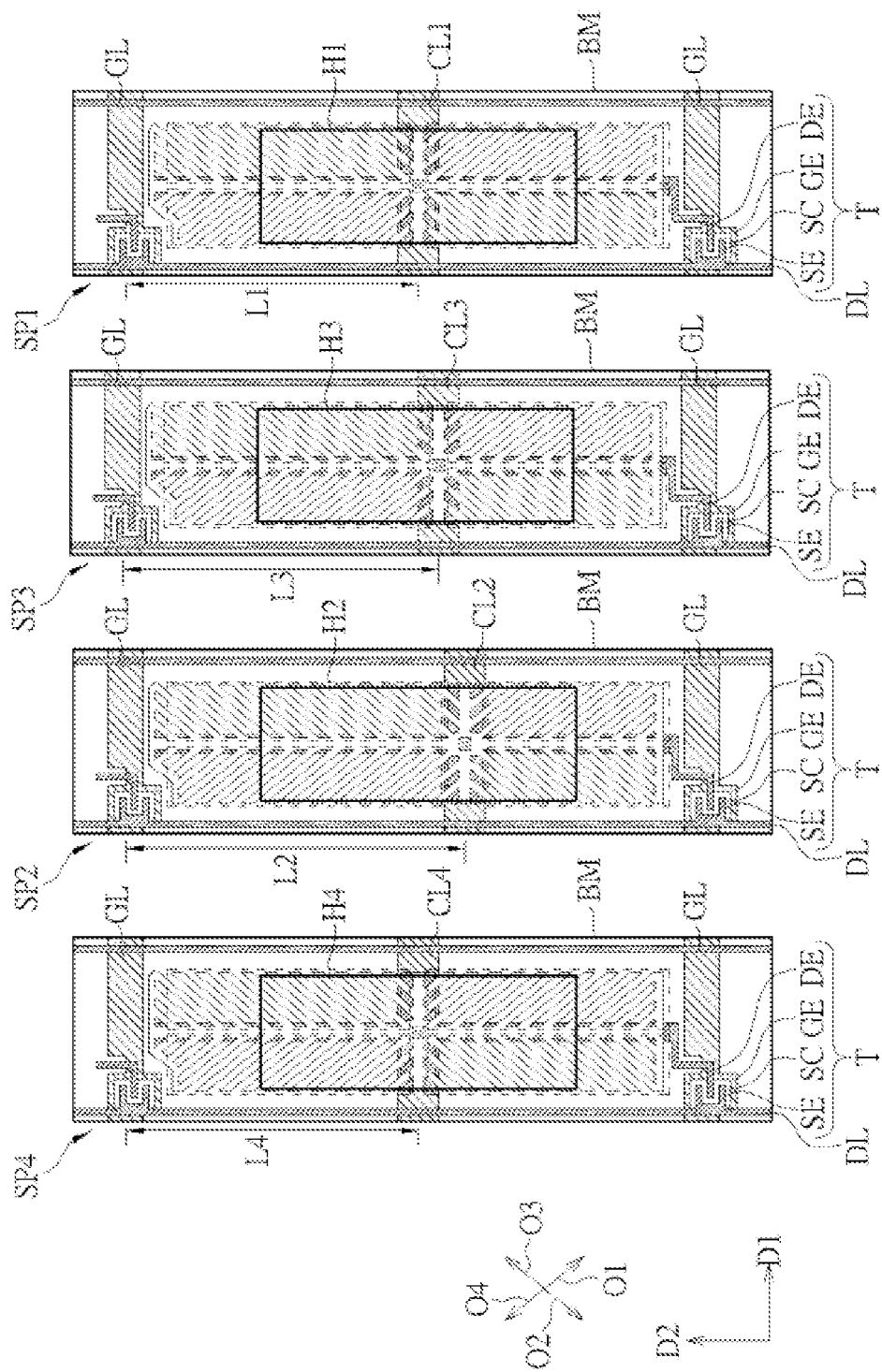
FIG. 7 is a partial enlarged schematic view of local pixels of a display panel according to a third embodiment of the present disclosure.
Figure 8:
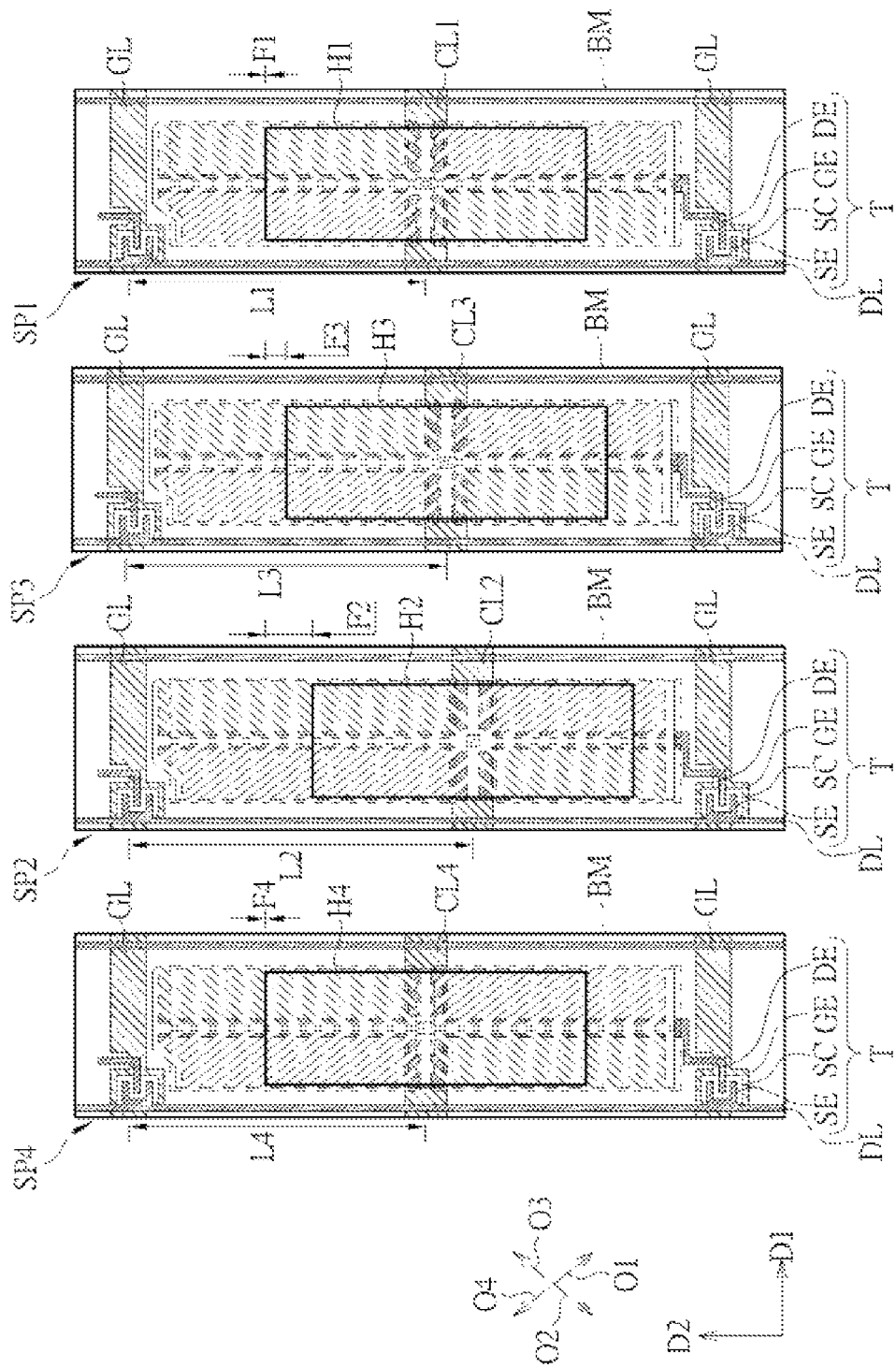
FIG. 8 is a schematic view of the pixels shown in FIG. 7 in a bent state.

A display panel in a third embodiment of the present disclosure is shown in FIGS. 7 and 8, where FIG. 7 is a partial enlarged schematic view of local pixels of the display panel according to the third embodiment of the present disclosure, and FIG. 8 is a schematic view of the pixels shown in FIG. 7 in a bent state. Referring to both FIGS. 1 and 7, the display panel 100 in this embodiment further includes a fourth region R4 located outside the first region R1, the second region R2, and the third region R3, that is, the fourth region R4 is neither located between the first region R1 and the second region R2 nor located between the second region R2 and the third region R3, and instead, is located on a side of the second region R2 which is opposite to the first region R1. The sub-pixels further include a plurality of fourth sub-pixels SP4, located in the fourth region R4 and arranged substantially along a first direction D1 to form a fourth sub-pixel row PA4. In addition, the common lines further include a fourth common line CL4 located in the fourth region R4 and extending substantially along the first direction D1 to pass through the fourth sub-pixel row PA4, where the fourth common line CL4 is substantially parallel to a central line C. In each fourth sub-pixel SP4 of the fourth sub-pixel row PA4 located in the fourth region R4, a fourth distance L4 exists between the fourth common line CL4 and the neighboring scan line GL along a second direction D2, and the fourth distance L4 is substantially equal to a first distance L1. In other words, the fourth common line CL4 neighbors with the corresponding scan line GL in the each fourth sub-pixel SP4. A design of a pixel electrode PE of the fourth region R4 is similar with that in the first embodiment, and is no longer elaborated herein. In addition, holes of a black matrix BM further include a plurality of fourth holes H4, separately exposing some of the fourth sub-pixels SP4 and the fourth common line CL4, and as observed in a vertical projection direction, the fourth common line CL4 has substantially equal distances from two adjacent edges of each fourth hole H4 in the second direction D2. Next, referring to FIG. 8, when the display panel 100 in the third embodiment is in a bent state (for example, when the display panel 100 is bent as shown in FIG. 3), each fourth hole H4 has a fourth offset F4 in the second direction D2 relative to the fourth common line CL4, and a position of the fourth hole H4 in the second direction D2 relative to the fourth sub-pixel SP4 has nearly no displacement. Therefore, the fourth hole H4 still exposes substantially the same area of the first alignment region A1, the second alignment region A2, the third alignment region A3, and the fourth alignment region A4. In addition, offsets and exposed areas of the first hole H1, the second hole H2, and the third hole H3 relative to the first sub-pixel SP1, the second sub-pixel SP2, and the third sub-pixel SP3 in this embodiment are substantially same as those in the first embodiment and the second embodiment, and are no longer elaborated. It should be noted that the fourth offset F4 in the fourth sub-pixel SP4 is substantially equal to the first offset F1 in the first sub-pixel SP1, and the fourth offset F4 is substantially about zero. Therefore, when in a bent state, the display panel in the third embodiment may provide a uniform and consistent wide-view-angle display effect.

Figure 9:
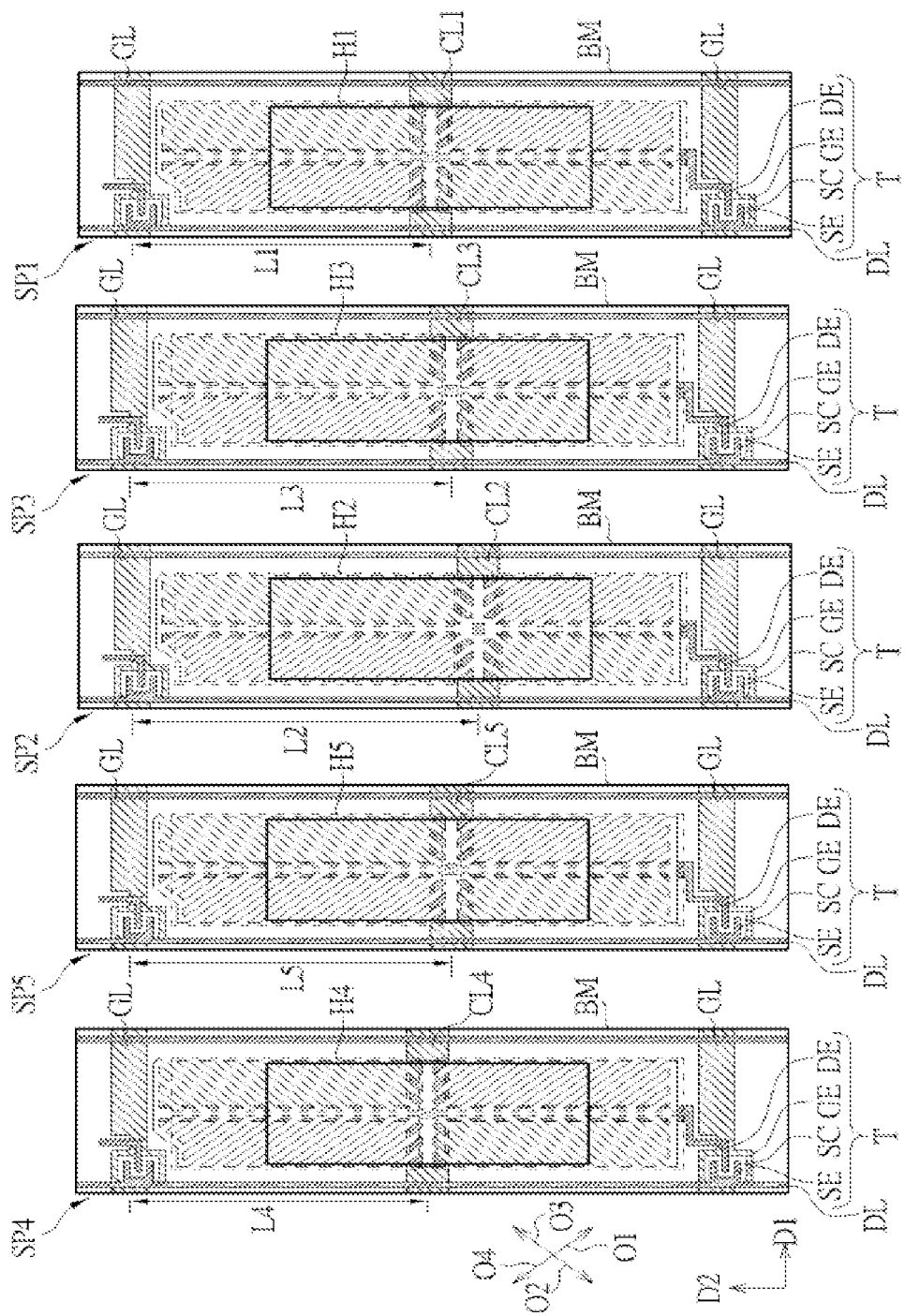
FIG. 9 is a partial enlarged schematic view of local pixels of a display panel according to a fourth embodiment of the present disclosure.
Figure 10:
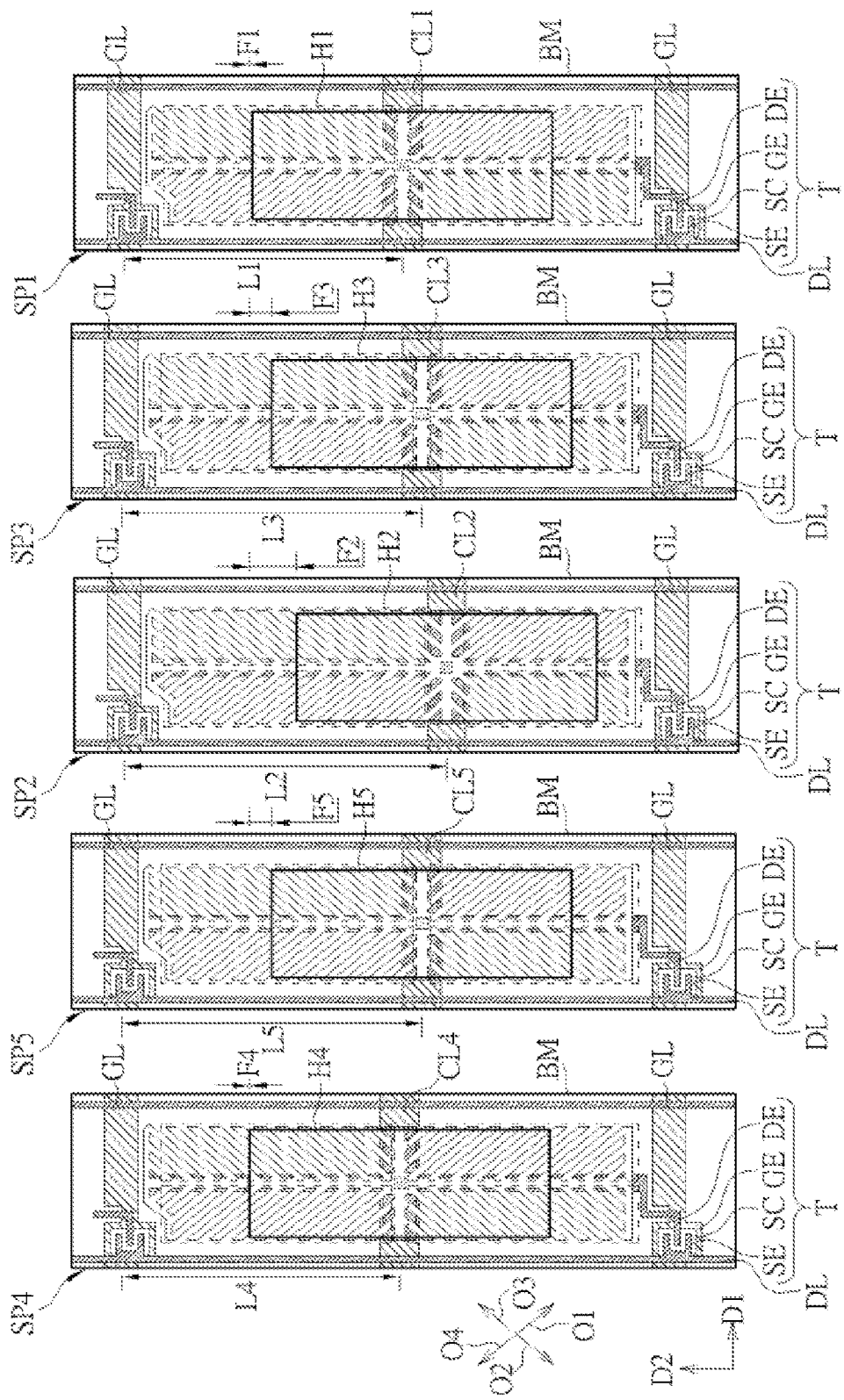
FIG. 10 is a schematic view of the pixels shown in FIG. 9 in a bent state.

A display panel in a fourth embodiment of the present disclosure is shown in FIGS. 9 and 10, where FIG. 9 is a partial enlarged schematic view of local pixels of the display panel according to the fourth embodiment of the present disclosure, and FIG. 10 is a schematic view of the pixels shown in FIG. 9 in a bent state. Referring to both FIGS. 1 and 9, the display panel 100 in this embodiment further includes a fifth region R5 located between the second region R2 and the fourth region R4, and the sub-pixels further include a plurality of fifth sub-pixels SP5 located in the fifth region R5 and arranged along a first direction D1 to form a fifth sub-pixel row PA5. In addition, the common lines further include a fifth common line CL5, located in the fifth region R5 and substantially extending along the first direction D1 to pass through the fifth sub-pixel row PA5, where the fifth common line CL5 are substantially parallel to the central line C. In each fifth sub-pixel SP5 of the fifth sub-pixel row PA5 located in the fifth region R5, a fifth distance L5 exists between the fifth common line CL5 and the neighboring scan line GL along the second direction D2. In other words, the fifth common line CL5 neighbors with the corresponding scan line GL in the each fifth sub-pixel SP5, and the fifth distance L5 is greater than the fourth distance L4 and is less than the second distance L2. Preferably, the fifth distance L5 is substantially equal to the third distance L3. A design of a pixel electrode PE of the fifth region R5 is similar with that in the first embodiment, and is no longer elaborated herein. In addition, the holes of the black matrix BM further include a plurality of fifth holes H5, separately exposing some of the fifth sub-pixels SP5 of the fifth sub-pixel row PA5 and the fifth common line CL5, and as observed in a vertical projection direction, the fifth common line CL5 substantially has unequal distances from two adjacent edges of each fifth hole H5 in the second direction D2. Referring to FIGS. 3 and 10, when the display panel 100 in the second embodiment is in a bent state (for example, when the display panel 100 is bent as shown in FIG. 3), each fifth hole H5 has a fifth offset F5 in the second direction D2 relative to the fifth common line CL5, causing a position of the fifth hole H5 in the fifth sub-pixel SP5 to move downwards. Therefore, the fifth hole H5 exposes substantially the same area of the first alignment region A1, the second alignment region A2, the third alignment region A3, and the fourth alignment region A4. In addition, the offsets and exposed area of the first hole H1, the second hole H2, the third hole H3, and the fourth hole H4 relative to the first sub-pixel SP1, the second sub-pixel SP2, the third sub-pixel SP3, and the fourth sub-pixel SP4 are substantially the same as those in the foregoing embodiments, and are no longer elaborated. It should be noted that the fifth offset F5 in the fifth sub-pixel SP5 is greater than the fourth offset F4, is less than the second offset F2, and is substantially equal to the third offset F3, where the fifth offset F5 is not equal to 0, and the fifth offset F5 is substantially equal to a difference value between the fifth distance L5 and the fourth distance L4. Therefore, when in a bent state, the display panel in the fourth embodiment may provide a uniform and consistent wide-angle display effect.

Figure 11:
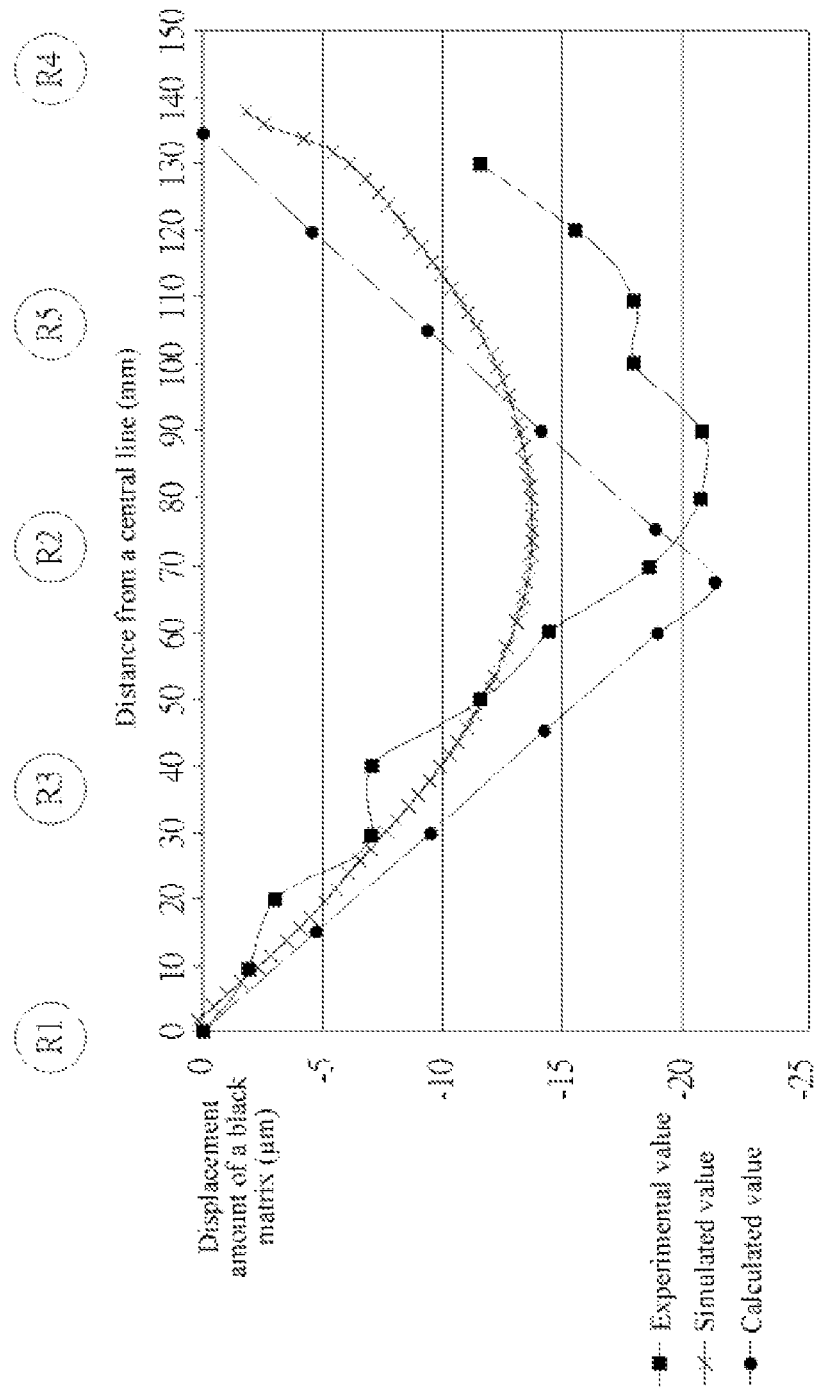
FIG. 11 is a diagram of a relationship between a displacement amount of a black matrix of a display panel and each region on the display panel according to the present disclosure.

Referring to FIGS. 1, 3 and 11 together, FIG. 11 is a diagram of a relationship between a displacement amount of a black matrix of a display panel and each region on the display panel according to the present disclosure, where a curve marked by a square symbol is an experimental value, a curve marked by a cross symbol is a simulated value, and a curve marked by a circular symbol is a calculated value. As shown in FIG. 11, a horizontal axis represents a distance between each position on the display panel 100 and the central line C measured by using the central line C of the display panel 100 shown in FIG. 1 as a reference point, that is, an origin (0) of the horizontal axis is a position of the central line. A vertical axis is a distance of a displacement of the black matrix BM of the display panel 100 when the display panel 100 is in a bent condition. In a case in which the display panel 100 is bent with the central line C as the axis in a direction towards the first substrate S1, that is, the first substrate S1 is located between the curvature center X and the second substrate S2, a deformation of the first substrate S1 is less than a deformation of the second substrate S2. Therefore, the black matrix BM is offset from an original position, causing the black matrix BM to expose partial alignment regions of each sub-pixel, resulting in a condition of uneven alignment. For example, in the first region R1 and the fourth region R4, that is, at positions that are about 0 millimeter (mm) and about 135 millimeters (mm) from the center, an extent of an offset of the black matrix BM is the minimal and is hardly offset. Therefore, in the present disclosure, it is designed that the first common line CL1 in the first region R1 and the fourth common line CL4 in the fourth region R4 are respectively located at the center of the first sub-pixel SP1 and the fourth sub-pixel SP4, so as to obtain a structure in which alignment regions have substantially equal area. In the second region R2, that is, at a position about 70 millimeters (mm) from the center, an extent of an offset of the black matrix BM is maximal, and the black matrix BM is offset by about 20 micrometers (μm). Therefore, in the present disclosure, during the design of the second common line CL2 in the second region R2, the second common line CL2 may be designed at a position of an offset (that is, the second offset F2) of about 20 micrometers (μm) below the center of the second sub-pixel SP2 according to the offset of the black matrix BM. Therefore, when the display panel 100 is bent, the center of the hole of the black matrix BM may just directly face the second common line CL2, so as to obtain a structure in which the exposed alignment regions have substantially equal area. In the third region R3 and the fifth region R5, that is, at positions about 30 millimeters (mm) and about 100 millimeters (mm) from the center, an extent of an offset of the black matrix BM is medium, and the black matrix BM is offset by about 10 micrometers (μm). Therefore, during the design of the third common line CL3 in the third region R3 and the fifth common line CL5 in the fifth region R5, the third common line CL3 and the fifth common line CL5 may be designed at positions of offsets (that is, the third offset F3 and the fifth offset F5) of about 10 micrometers (μm) below the centers of the third sub-pixel SP3 and the fifth sub-pixel SP5 according to the offset of the black matrix BM. Therefore, when the display panel 100 is bent, the center of the hole of the black matrix BM may just directly face the third common line CL3 and the fifth common line CL5, so as to obtain a structure in which exposed alignment regions have substantially equal area. Similarly, this embodiment of the present disclosure may also be used in a case in which the display panel 100 is bent with the central line C as the axis in a direction towards the second substrate S2, that is, the second substrate S2 is located between the curvature center X and the first substrate S1, and the foregoing related data in this embodiment changes accordingly.

Moreover, all the foregoing embodiments of the present disclosure are implementation examples in which a common electrode (not shown) is included on a second substrate S2 and a pixel electrode PE is included on a first substrate S1. Therefore, when a voltage is applied on the pixel electrode PE of the first substrate S1, the pixel electrode PE on the first substrate S1 and the common electrode on the second substrate S2 form a vertical electric field to facilitate deflection of a display medium M (for example, a liquid crystal molecule) between the first substrate S1 and the second substrate S2. Therefore, by means of the foregoing embodiments, an alignment defect that occurs in a second substrate S2 and a first substrate S1 of a curved display panel or a flexible display panel when the display panel is bent may be alleviated. On the other hand, a structural design in which a pixel electrode PE and a common electrode (not shown) are both provided on a first substrate S1, a common line is connected to the common electrode, and no common electrode is provided on a second substrate S2 is used as a contrast example for the description as follows. When a voltage is applied on the pixel electrode PE on the first substrate S1, the pixel electrode PE on the first substrate S1 and the common electrode (not shown) form a horizontal electric field to drive deflection of a display medium M (for example, a liquid crystal molecule) between the first substrate S1 and the second substrate S2. Because for the horizontal electric field, an alignment offset does not occur between the second substrate S2 and the first substrate S1 to cause an alignment defect, the display medium M between the first substrate S1 and the second substrate S2 can still deflect according to an originally predetermined direction. Moreover, even if an offset occurs in the first substrate S1 and the second substrate S2 when the display panel is bent, the black matrix on the second substrate S2 can still mask a position where the offset occurs. Therefore, the design in which a pixel electrode PE and a common electrode (not shown) are both provided on a first substrate S1, a common line is connected to the common electrode, and no common electrode is provided on a second substrate S2 is not applicable to the foregoing embodiments of the present disclosure.

Figure 12:
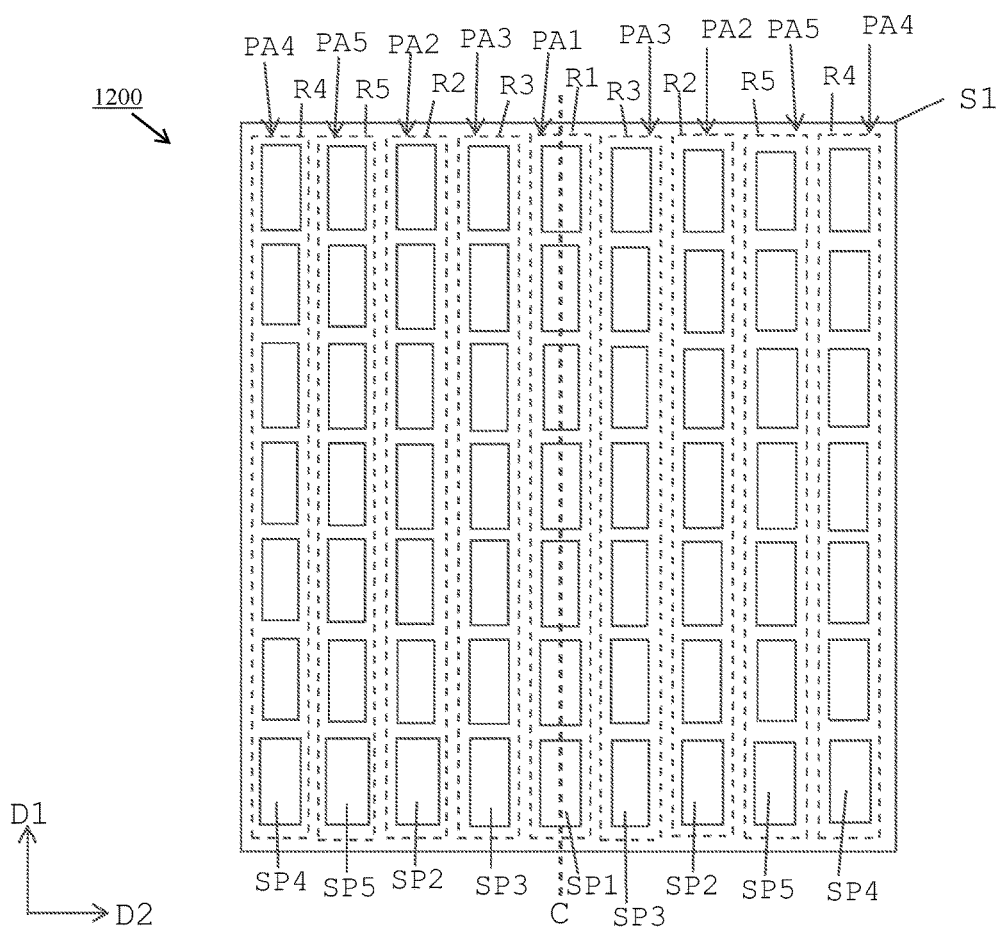
FIG. 12 is a schematic top view of a display panel according to a fifth embodiment of the present disclosure.

In certain embodiments, the row designs in the foregoing embodiments of the present disclosure can be applicable to column designs. For example, FIG. 12 is a schematic top view of a display panel according to a fifth embodiment of the present disclosure. Specifically, the differences between the display panel as shown in FIG. 12 and the display panel 100 as shown in FIG. 1 exist in that, as shown in FIG. 1, the display panel 100 is in a row design, where the first direction D1 is a row direction and the second direction D2 is a column direction. In comparison, as shown in FIG. 12, the display panel 1200 is in a column design, where the first direction D1 is the column direction and the second direction D2 is the row direction. In this case, the central line C is located at the center of the display panel 1200 and substantially extends along the first direction D1 (i.e., the column direction) to substantially and equally divide the display panel 1200 shown in FIG. 12 into a left block (or area, or region) and a right block. The multiple regions, including the first region R1, the second regions R2, the third regions R3, the fourth regions R4 and the fifth regions R5 also extend in the column direction. Further, the sub-pixels in this embodiment include a plurality of first sub-pixels SP1, a plurality of second sub-pixels SP2, a plurality of third sub-pixels SP3, a plurality of fourth sub-pixels SP4 and a plurality of fifth sub-pixels SP5. The first sub-pixels SP1 are located in the first region R1 and are substantially arranged along the first direction D1 (i.e., the column direction) to form at least one first sub-pixel column PA1, and the second sub-pixels SP2 are located in each of the second regions R2 and are substantially arranged along the first direction D1 (i.e., the column direction) to form a corresponding second sub-pixel column PA2. Similarly, the third sub-pixels SP3 are located in each of the third regions R3 and are substantially arranged along the first direction D1 (i.e., the column direction) to form a corresponding third sub-pixel column PA3, the fourth sub-pixels SP4 are located in each of the fourth regions R4 and are substantially arranged along the first direction D1 (i.e., the column direction) to form a corresponding fourth sub-pixel column PA4, and the fifth sub-pixels SP5 are located in each of the fifth regions R5 and are substantially arranged along the first direction D1 (i.e., the column direction) to form a corresponding fifth sub-pixel column PA5. Other details of the display panel 1200 as shown in FIG. 12 are similar to the display panel 100 as shown in FIG. 1, and are not hereinafter elaborated.

In summary, the display panel of the present disclosure may be a curved display panel or a flexible display panel. When the display panel is in a planar state, in sub-pixels of different regions or different positions of the display panel of the present disclosure, a hole of a black matrix and a common line in a sub-pixel have different corresponding designs. Therefore, when the display panel is in a bent state, it may be ensured that exposed areas of alignment regions in each sub-pixel by the hole of the black matrix after a displacement are substantially the same, causing all sub-pixels to have an effect of consistent multi-region alignment rather than to cause a problem of a color difference in viewing from different view angles. In addition, the display panel of the present disclosure is a multi-region alignment display panel, that is, each sub-pixel has multiple alignment regions, where quantities, shapes, and configurations of the alignment regions may be changed according to requirements and are not limited to the foregoing embodiments. Moreover, the effect of multi-region alignment may be achieved by using any suitable multi-region alignment technology, for example, a multi-region vertical alignment technology, a polymer stabilized alignment technology or any other technology that can enable the sub-pixels to generate multiple different alignment regions, which is not limited thereto. Moreover, the designs (for example, row design) in the foregoing embodiments of the present disclosure can be applicable to column designs.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A display panel, comprising:
    a first substrate;
    a second substrate;
    a display medium located between the first substrate and the second substrate;
    a plurality of scan lines and a plurality of data lines, located on the first substrate, wherein each scan line extends along a first direction, each data line extends along a second direction, and a virtual central line is defined to extend along the first direction such that the display panel is line-symmetrical to the virtual central line, and a first region and a second region located outside the first region are defined on the display panel, wherein the virtual central line passes through the first region;
    a plurality of sub-pixels, disposed on the first substrate, wherein each sub-pixel comprises at least one active element and a pixel electrode connected to a drain electrode of the active element, a source electrode of each active element is connected to one of the data lines, a gate electrode of each active element is connected to one of the scan lines, and the sub-pixels comprise:
        a plurality of first sub-pixels, located in the first region and arranged into at least one first sub-pixel row along the first direction; and
        a plurality of second sub-pixels, located in the second region and arranged into at least one second sub-pixel row along the first direction;
    a plurality of common lines, disposed on the first substrate, wherein the common lines comprise:
        at least one first common line, located in the first region, and extending along the first direction to pass through the first sub-pixel row, wherein in each first sub-pixel of the first sub-pixel row located in the first region, a first distance exists between the first common line and a first neighboring scan line along the second direction; and
        at least one second common line, located in the second region, and extending along the first direction to pass through the second sub-pixel row, the first common line and the second common line being arranged along the second direction, wherein in each second sub-pixel of the second sub-pixel row located in the second region, a second distance exists between the second common line and a second neighboring scan line along the second direction, and the first distance is not equal to the second distance; and
    a black matrix, disposed on the second substrate, wherein the black matrix has a plurality of holes respectively and partially exposing the sub-pixels, each of the holes corresponds to one of the sub-pixels, the holes comprise a plurality of first holes and a plurality of second holes, the first holes respectively expose the first sub-pixels of the first sub-pixel row and the first common line located in the first region, and the second holes respectively expose the second sub-pixels of the second sub-pixel row and the second common line located in the second region.

2. The display panel according to claim 1, wherein as observed in a projection direction perpendicular to the display panel, the first common line has substantially equal distances from two adjacent edges of each first hole in the second direction, and the second common line substantially has unequal distances from two adjacent edges of each second hole in the second direction.

3. The display panel according to claim 1, wherein the second distance is greater than the first distance.

4. The display panel according to claim 3, wherein for each of the sub-pixels, the pixel electrode comprises:
    a cross-shaped main electrode, comprising a first main electrode extending along the first direction, and a second main electrode extending along the second direction and intersecting with the first main electrode; and
    a plurality of branch electrodes, wherein an end of each branch electrode is connected to the cross-shaped main electrode, and each of the branch electrodes extends from the cross-shaped main electrode such that each of the sub-pixels has at least four different alignment regions, wherein the branch electrodes in each of the at least four different alignment regions extends toward a different direction such that all of the branch electrodes extend along at least four different directions.

5. The display panel according to claim 4, wherein the first main electrode of the cross-shaped main electrode of each pixel electrode overlaps the corresponding common line in a projection direction perpendicular to the display panel.

6. The display panel according to claim 4, wherein the alignment regions of each first sub-pixel have substantially equal areas, and the alignment regions of each second sub-pixel have substantially unequal areas.

7. The display panel according to claim 6, further comprising a third region located between the first region and the second region, wherein
    the sub-pixels further comprise a plurality of third sub-pixels, located in the third region and arranged along the first direction into at least one third sub-pixel row; and
    the common lines further comprise at least one third common line, located in the third region and extending along the first direction to pass through the third sub-pixel row, wherein in each third sub-pixel of the third sub-pixel row located in the third region, a third distance exists between the third common line and a neighboring scan line along the second direction, the third distance is greater than the first distance, and the third distance is less than the second distance.

8. The display panel according to claim 7, wherein the holes of the black matrix further comprise a plurality of third holes, respectively exposing the third sub-pixels of the third sub-pixel row and the third common line located in the third region, and as observed in a projection direction perpendicular to the display panel, the third common line substantially has unequal distances from two adjacent edges of each third hole in the second direction.

9. The display panel according to claim 7, further comprising a fourth region located outside the first region, the second region, and the third region, and the fourth region being neither located between the first region and the second region nor located between the second region and the third region, wherein the sub-pixels further comprise a plurality of fourth sub-pixels, located in the fourth region and arranged along the first direction into at least one fourth sub-pixel row; and the common lines further comprise at least one fourth common line, located in the fourth region and extending along the first direction to pass through the fourth sub-pixel row, wherein in each fourth sub-pixel of the fourth sub-pixel row located in the fourth region, a fourth distance exists between the fourth common line and a neighboring scan line along the second direction, and the fourth distance is substantially equal to the first distance.

10. The display panel according to claim 9, wherein the holes of the black matrix further comprise a plurality of fourth holes, respectively exposing the fourth sub-pixels of the fourth sub-pixel row and the fourth common line located in the fourth region, and as observed in a projection direction perpendicular to the display panel, the fourth common line has substantially equal distances from two adjacent edges of each fourth hole in the second direction.

11. The display panel according to claim 9, further comprising a fifth region located between the second region and the fourth region, wherein the sub-pixels further comprise a plurality of fifth sub-pixels, located in the fifth region and arranged along the first direction into at least one fifth sub-pixel row; and the common lines further comprise at least one fifth common line, located in the fifth region and extending along the first direction to pass through the fifth sub-pixel row, wherein in each fifth sub-pixel of the fifth sub-pixel row located in the fifth region, a fifth distance exists between the fifth common line and a neighboring scan line along the second direction, the fifth distance is greater than the fourth distance, and the fifth distance is less than the second distance.

12. The display panel according to claim 11, wherein the holes of the black matrix further comprise a plurality of fifth holes, respectively exposing the fifth sub-pixels of the fifth sub-pixel row and the fifth common line located in the fifth region, and as observed in a vertical projection direction perperpendicular to the display panel, the fifth common line substantially has unequal distances from two adjacent edges of each fifth hole in the second direction.

13. A display panel, comprising:
a first substrate;
a second substrate;
a display medium located between the first substrate and the second substrate;
a plurality of scan lines and a plurality of data lines, located on the first substrate, wherein each scan line extends along a first direction, each data line extends along a second direction, and a virtual central line is defined to extend along the first direction such that the display panel is line-symmetrical to the virtual central line, and a first region and a second region located outside the first region are defined on the display panel, wherein the virtual central line passes through the first region;
a plurality of sub-pixels, disposed on the first substrate, wherein each sub-pixel comprises at least one active element and a pixel electrode connected to a drain electrode of the active element, a source electrode of each active element is connected to one of the data lines, a gate electrode of each active element is connected to one of the scan lines, and the sub-pixels comprise:

a plurality of first sub-pixels, located in the first region and arranged into at least one first sub-pixel column along the first direction; and a plurality of second sub-pixels, located in the second region and arranged into at least one second sub-pixel column along the first direction;

a plurality of common lines, disposed on the first substrate, wherein the common lines comprise:

at least one first common line, located in the first region, and extending along the first direction to pass through the first sub-pixel column; and at least one second common line, located in the second region, disposed on the first substrate, and extending along the first direction to pass through the second sub-pixel column, the first common line and the second common line shifting from each other along the second direction; and a black matrix, disposed on the second substrate, wherein the black matrix has a plurality of holes respectively and partially exposing the sub-pixels, each of the holes corresponds to one of the sub-pixels, the holes comprise a plurality of first holes and a plurality of second holes, the first holes respectively expose the first sub-pixels of the first sub-pixel column and the first common line located in the first region, and the second holes respectively expose the second sub-pixels of the second sub-pixel column and the second common line located in the second region, wherein when the display panel presents a bent state, the display panel is bent with the virtual central line as an axis, a first offset exists in the second direction between each first hole and the first common line, a second offset exists in the second direction between each second hole and the second common line, and the first offset is not equal to the second offset.

14. The display panel according to claim 13, wherein in the bent state, the display panel has a curvature center, and the first substrate is located between the second substrate and the curvature center.

15. The display panel according to claim 13, wherein in an unbent state, as observed in a projection direction perpendicular to the display panel, the first common line has substantially equal distances from two adjacent edges of each first hole in the second direction, and the second common line substantially has unequal distances from two adjacent edges of each second hole in the second direction; and in the bent state, as observed in the projection direction perpendicular to the display panel, the first common line has substantially equal distances from the two adjacent edges of each first hole in the second direction, and the second common line has substantially equal distances from the two adjacent edges of each second hole in the second direction.

16. The display panel according to claim 15, wherein in each first sub-pixel of the first sub-pixel column located in the first region, a first distance exists between the first common line and a neighboring scan line along the second direction, in each second sub-pixel of the second sub-pixel column located in the second region, a second distance exists between the second common line and a neighboring scan line along the second direction, and the first distance is not equal to the second distance.

17. The display panel according to claim 16, wherein the second distance is greater than the first distance, the first offset is substantially equal to 0, and the second offset is substantially equal to a difference value between the second distance and the first distance.

18. The display panel according to claim 13, wherein for each of the sub-pixels, the pixel electrode comprises:
a cross-shaped main electrode, comprising a first main electrode extending along the first direction, and a second main electrode extending along the second direction and intersecting with the first main electrode; and
a plurality of branch electrodes, wherein an end of each branch electrode is connected to the cross-shaped main electrode, and each of the branch electrodes extends from the cross-shaped main electrode such that each of the sub-pixels has at least four different alignment regions, wherein the branch electrodes in each of the at least four different alignment regions extends toward a different direction such that all of the branch electrodes extend along at least four different directions.

19. The display panel according to claim 18, wherein the first main electrode of the cross-shaped main electrode of each pixel electrode overlaps the corresponding common line in a projection direction perpendicular to the display panel.

20. The display panel according to claim 18, wherein the alignment regions of each first sub-pixel have substantially equal areas, and the alignment regions of each second sub-pixel have substantially unequal areas, wherein in an unbent state, the alignment regions of the first sub-pixel exposed by the first hole have substantially equal areas, and the alignment regions of the second sub-pixel exposed by the second hole have substantially unequal areas, in the bent state, the alignment regions of the first sub-pixel exposed by the first hole have substantially equal areas, and the alignment regions of the second sub-pixel exposed by the second hole have substantially equal areas.

21. The display panel according to claim 16, further comprising a third region located between the first region and the second region, wherein
the sub-pixels further comprise a plurality of third sub-pixels, located in the third region and arranged along the first direction into at least one third sub-pixel column;
the common lines further comprise at least one third common line, located in the third region and extending along the first direction to pass through the third sub-pixel column; and
the holes of the black matrix further comprise a plurality of third holes, respectively exposing the third sub-pixels of the third sub-pixel column and the third common line located in the third region, wherein in the bent state, a third offset exists in the second direction between each third hole and the third common line, the third offset is greater than the first offset, and the third offset is less than the second offset.

22. The display panel according to claim 21, wherein in each third sub-pixel of the third sub-pixel column located in the third region, a third distance exists between the third common line and a neighboring scan line along the second direction, the third distance is greater than the first distance, the third distance is less than the second distance, and the third offset is substantially equal to a difference value between the third distance and the first distance.

23. The display panel according to claim 21, further comprising a fourth region located outside the first region, the second region, and the third region, and the fourth region being neither located between the first region and the second region nor located between the second region and the third region, wherein
the sub-pixels further comprise a plurality of fourth sub-pixels, located in the fourth region and arranged along the first direction into at least one fourth sub-pixel column;
the common lines further comprise at least one fourth common line, located in the fourth region and extending along the first direction to pass through the fourth sub-pixel column; and
the holes of the black matrix further comprise a plurality of fourth holes, respectively exposing the fourth sub-pixels of the fourth sub-pixel column and the fourth common line located in the fourth region, wherein in the bent state, a fourth offset exists in the second direction between each fourth hole and the fourth common line, and the fourth offset is substantially equal to the first offset.

24. The display panel according to claim 23, wherein in each fourth sub-pixel of the fourth sub-pixel column located in the fourth region, a fourth distance exists between the fourth common line and a neighboring scan line along the second direction, and the fourth distance is substantially equal to the first distance.

25. The display panel according to claim 23, further comprising a fifth region located between the second region and the fourth region, wherein
the sub-pixels further comprise a plurality of fifth sub-pixels, located in the fifth region and arranged along the first direction into at least one fifth sub-pixel column; and
the common lines further comprise at least one fifth common line, located in the fifth region and extending along the first direction to pass through the fifth sub-pixel column, wherein in the bent state, a fifth offset exists in the second direction between each fifth hole and the fifth common line, the fifth offset is greater than the fourth offset, and the fifth offset is less than the second offset.

26. The display panel according to claim 25, wherein in each fifth sub-pixel of the fifth sub-pixel column located in the fifth region, a fifth distance exists between the fifth common line and a neighboring scan line along the second direction, the fifth distance is greater than the fourth distance, the fifth distance is less than the second distance, and the fifth offset is substantially equal to a difference value between the fifth distance and the fourth distance.

27. A display panel, comprising:
a first substrate;
a second substrate;
a display medium located between the first substrate and the second substrate;
a plurality of scan lines and a plurality of data lines, located on the first substrate, wherein each scan line extends along a first direction, each data line extends along a second direction, and a virtual central line is defined to extend along the first direction such that the display panel is line-symmetrical to the virtual central line, and a first region and a second region located outside the first region are defined on the display panel, wherein the virtual central line passes through the first region;
a plurality of sub-pixels, disposed on the first substrate, wherein each sub-pixel comprises at least one active element and a pixel electrode connected to a drain electrode of the active element, a source electrode of each active element is connected to one of the data lines, a gate electrode of each active element is connected to one of the scan lines, and the sub-pixels comprise:
- a plurality of first sub-pixels, located in the first region and arranged into at least one first sub-pixel column along the first direction; and
- a plurality of second sub-pixels, located in the second region and arranged into at least one second sub-pixel column along the first direction;

a plurality of common lines, disposed on the first substrate, wherein the common lines comprise:
- at least one first common line, located in the first region, and extending along the first direction to pass through the first sub-pixel column, wherein in each first sub-pixel of the first sub-pixel column located in the first region, a first distance exists between the first common line and a first neighboring scan line along the second direction; and
- at least one second common line, located in the second region, and extending along the first direction to pass through the second sub-pixel column, the first common line and the second common line being arranged along the second direction, wherein in each second sub-pixel of the second sub-pixel column located in the second region, a second distance exists between the second common line and a second neighboring scan line along the second direction, and the first distance is not equal to the second distance; and a black matrix, disposed on the second substrate, wherein the black matrix has a plurality of holes respectively and partially exposing the sub-pixels, each of the holes corresponds to one of the sub-pixels, the holes comprise a plurality of first holes and a plurality of second holes, the first holes respectively expose the first sub-pixels of the first sub-pixel column and the first common line located in the first region, and the second holes respectively expose the second sub-pixels of the second sub-pixel column and the second common line located in the second region.

28. The display panel according to claim 27, wherein as observed in a projection direction perpendicular to the display panel, the first common line has substantially equal distances from two adjacent edges of each first hole in the second direction, and the second common line substantially has unequal distances from two adjacent edges of each second hole in the second direction.

29. The display panel according to claim 27, wherein the second distance is greater than the first distance.

30. The display panel according to claim 29, wherein for each of the sub-pixels, the pixel electrode comprises:
- a cross-shaped main electrode, comprising a first main electrode extending along the first direction, and a second main electrode extending along the second direction and intersecting with the first main electrode; and
- a plurality of branch electrodes, wherein an end of each branch electrode is connected to the cross-shaped main electrode, and each of the branch electrodes extends from the cross-shaped main electrode such that each of the sub-pixels has at least four different alignment regions, wherein the branch electrodes in each of the at least four different alignment regions extends toward a different direction such that all of the branch electrodes extend along at least four different directions.

31. The display panel according to claim 30, wherein the first main electrode of the cross-shaped main electrode of each pixel electrode overlaps the corresponding common line in a projection direction perpendicular to the display panel.

32. The display panel according to claim 30, wherein the alignment regions of each first sub-pixel have substantially equal areas, and the alignment regions of each second sub-pixel have substantially unequal areas.

33. The display panel according to claim 32, further comprising a third region located between the first region and the second region, wherein
- the sub-pixels further comprise a plurality of third sub-pixels, located in the third region and arranged along the first direction into at least one third sub-pixel column; and
- the common lines further comprise at least one third common line, located in the third region and extending along the first direction to pass through the third sub-pixel column, wherein in each third sub-pixel of the third sub-pixel column located in the third region, a third distance exists between the third common line and a neighboring scan line along the second direction, the third distance is greater than the first distance, and the third distance is less than the second distance.

34. The display panel according to claim 33, wherein the holes of the black matrix further comprise a plurality of third holes, respectively exposing the third sub-pixels of the third sub-pixel column and the third common line located in the third region, and as observed in a projection direction perpendicular to the display panel, the third common line substantially has unequal distances from two adjacent edges of each third hole in the second direction.

35. The display panel according to claim 33, further comprising a fourth region located outside the first region, the second region, and the third region, and the fourth region being neither located between the first region and the second region nor located between the second region and the third region, wherein
- the sub-pixels further comprise a plurality of fourth sub-pixels, located in the fourth region and arranged along the first direction into at least one fourth sub-pixel column; and
- the common lines further comprise at least one fourth common line, located in the fourth region and extending along the first direction to pass through the fourth sub-pixel column, wherein in each fourth sub-pixel of the fourth sub-pixel column located in the fourth region, a fourth distance exists between the fourth common line and a neighboring scan line along the second direction, and the fourth distance is substantially equal to the first distance.

36. The display panel according to claim 35, wherein the holes of the black matrix further comprise a plurality of fourth holes, respectively exposing the fourth sub-pixels of the fourth sub-pixel column and the fourth common line located in the fourth region, and as observed in a projection direction perpendicular to the display panel, the fourth common line has substantially equal distances from two adjacent edges of each fourth hole in the second direction.

37. The display panel according to claim 35, further comprising a fifth region located between the second region and the fourth region, wherein
- the sub-pixels further comprise a plurality of fifth sub-pixels, located in the fifth region and arranged along the first direction into at least one fifth sub-pixel column; and the common lines further comprise at least one fifth common line, located in the fifth region and extending along the first direction to pass through the fifth sub-pixel column, wherein in each fifth sub-pixel of the fifth sub-pixel column located in the fifth region, a fifth distance exists between the fifth common line and a neighboring scan line along the second direction, the fifth distance is greater than the fourth distance, and the fifth distance is less than the second distance.

38. The display panel according to claim 37, wherein the holes of the black matrix further comprise a plurality of fifth holes, respectively exposing the fifth sub-pixels of the fifth sub-pixel column and the fifth common line located in the fifth region, and as observed in a vertical projection direction perpendicular to the display panel, the fifth common line substantially has unequal distances from two adjacent edges of each fifth hole in the second direction.

39. A display panel, comprising:
a first substrate;
a second substrate;
a display medium located between the first substrate and the second substrate;
a plurality of scan lines and a plurality of data lines, located on the first substrate, wherein each scan line extends along a first direction, each data line extends along a second direction, and a virtual central line is defined to extend along the first direction such that the display panel is line-symmetrical to the virtual central line, and a first region and a second region located outside the first region are defined on the display panel, wherein the virtual central line passes through the first region;
a plurality of sub-pixels, disposed on the first substrate, wherein each sub-pixel comprises at least one active element and a pixel electrode connected to a drain electrode of the active element, a source electrode of each active element is connected to one of the data lines, a gate electrode of each active element is connected to one of the scan lines, and the sub-pixels comprise:
a plurality of first sub-pixels, located in the first region and arranged into at least one first sub-pixel row along the first direction; and
a plurality of second sub-pixels, located in the second region and arranged into at least one second sub-pixel row along the first direction;
a plurality of common lines, disposed on the first substrate, wherein the common lines comprise:
at least one first common line, located in the first region, and extending along the first direction to pass through the first sub-pixel row; and
at least one second common line, located in the second region, disposed on the first substrate, and extending along the first direction to pass through the second sub-pixel row, the first common line and the second common line shifting from each other along the second direction; and
a black matrix, disposed on the second substrate, wherein the black matrix has a plurality of holes respectively and partially exposing the sub-pixels, each of the holes corresponds to one of the sub-pixels, the holes comprise a plurality of first holes and a plurality of second holes, the first holes respectively expose the first sub-pixels of the first sub-pixel row and the first common line located in the first region, and the second holes respectively expose the second sub-pixels of the second sub-pixel row and the second common line located in the second region,
wherein when the display panel presents a bent state, the display panel is bent with the virtual central line as an axis, a first offset exists in the second direction between each first hole and the first common line, a second offset exists in the second direction between each second hole and the second common line, and the first offset is not equal to the second offset.

40. The display panel according to claim 39, wherein in the bent state, the display panel has a curvature center, and the first substrate is located between the second substrate and the curvature center.

41. The display panel according to claim 39, wherein in an unbent state, as observed in a projection direction perpendicular to the display panel, the first common line has substantially equal distances from two adjacent edges of each first hole in the second direction, and the second common line substantially has unequal distances from two adjacent edges of each second hole in the second direction; and in the bent state, as observed in the projection direction perpendicular to the display panel, the first common line has substantially equal distances from the two adjacent edges of each first hole in the second direction, and the second common line has substantially equal distances from the two adjacent edges of each second hole in the second direction.

42. The display panel according to claim 41, wherein in each first sub-pixel of the first sub-pixel row located in the first region, a first distance exists between the first common line and a neighboring scan line along the second direction, in each second sub-pixel of the second sub-pixel row located in the second region, a second distance exists between the second common line and a neighboring scan line along the second direction, and the first distance is not equal to the second distance.

43. The display panel according to claim 42, wherein the second distance is greater than the first distance, the first offset is substantially equal to 0, and the second offset is substantially equal to a difference value between the second distance and the first distance.

44. The display panel according to claim 39, wherein for each of the sub-pixels, the pixel electrode comprises:
a cross-shaped main electrode, comprising a first main electrode extending along the first direction, and a second main electrode extending along the second direction and intersecting with the first main electrode; and
a plurality of branch electrodes, wherein an end of each branch electrode is connected to the cross-shaped main electrode, and each of the branch electrodes extends from the cross-shaped main electrode such that each of the sub-pixels has at least four different alignment regions, wherein the branch electrodes in each of the at least four different alignment regions extends toward a different direction such that all of the branch electrodes extend along at least four different directions.

45. The display panel according to claim 44, wherein the first main electrode of the cross-shaped main electrode of each pixel electrode overlaps the corresponding common line in a projection direction perpendicular to the display panel.

46. The display panel according to claim 44, wherein the alignment regions of each first sub-pixel have substantially equal areas, and the alignment regions of each second sub-pixel have substantially unequal areas, wherein in an unbent state, the alignment regions of the first sub-pixel exposed by the first hole have substantially equal areas, and the alignment regions of the second sub-pixel exposed by the second hole have substantially unequal areas, in the bent state, the alignment regions of the first sub-pixel exposed by the first hole have substantially equal areas, and the alignment regions of the second sub-pixel exposed by the second hole have substantially equal areas.

47. The display panel according to claim 42, further comprising a third region located between the first region and the second region, wherein
- the sub-pixels further comprise a plurality of third sub-pixels, located in the third region and arranged along the first direction into at least one third sub-pixel row;
- the common lines further comprise at least one third common line, located in the third region and extending along the first direction to pass through the third sub-pixel row; and
- the holes of the black matrix further comprise a plurality of third holes, respectively exposing the third sub-pixels of the third sub-pixel row and the third common line located in the third region, wherein in the bent state, a third offset exists in the second direction between each third hole and the third common line, the third offset is greater than the first offset, and the third offset is less than the second offset.

48. The display panel according to claim 47, wherein in each third sub-pixel of the third sub-pixel row located in the third region, a third distance exists between the third common line and a neighboring scan line along the second direction, the third distance is greater than the first distance, the third distance is less than the second distance, and the third offset is substantially equal to a difference value between the third distance and the first distance.

49. The display panel according to claim 47, further comprising a fourth region located outside the first region, the second region, and the third region, and the fourth region being neither located between the first region and the second region nor located between the second region and the third region, wherein
- the sub-pixels further comprise a plurality of fourth sub-pixels, located in the fourth region and arranged along the first direction into at least one fourth sub-pixel row;
- the common lines further comprise at least one fourth common line, located in the fourth region and extending along the first direction to pass through the fourth sub-pixel row; and
- the holes of the black matrix further comprise a plurality of fourth holes, respectively exposing the fourth sub-pixels of the fourth sub-pixel row and the fourth common line located in the fourth region, wherein in the bent state, a fourth offset exists in the second direction between each fourth hole and the fourth common line, and the fourth offset is substantially equal to the first offset.

50. The display panel according to claim 49, wherein in each fourth sub-pixel of the fourth sub-pixel row located in the fourth region, a fourth distance exists between the fourth common line and a neighboring scan line along the second direction, and the fourth distance is substantially equal to the first distance.

51. The display panel according to claim 49, further comprising a fifth region located between the second region and the fourth region, wherein
- the sub-pixels further comprise a plurality of fifth sub-pixels, located in the fifth region and arranged along the first direction into at least one fifth sub-pixel row; and
- the common lines further comprise at least one fifth common line, located in the fifth region and extending along the first direction to pass through the fifth sub-pixel row, wherein in the bent state, a fifth offset exists in the second direction between each fifth hole and the fifth common line, the fifth offset is greater than the fourth offset, and the fifth offset is less than the second offset.

52. The display panel according to claim 51, wherein in each fifth sub-pixel of the fifth sub-pixel row located in the fifth region, a fifth distance exists between the fifth common line and a neighboring scan line along the second direction, the fifth distance is greater than the fourth distance, the fifth distance is less than the second distance, and the fifth offset is substantially equal to a difference value between the fifth distance and the fourth distance.

* * * * *